(12) United States Patent
Pons et al.

(10) Patent No.: US 10,546,159 B2
(45) Date of Patent: Jan. 28, 2020

(54) SYSTEM AND METHOD FOR HANDLING PUMPING UNITS IN OUT-OF-BALANCE CONDITION

(71) Applicant: Weatherford Technology Holdings, LLC, Houston, TX (US)

(72) Inventors: Victoria M. Pons, Katy, TX (US); Lewis Lu, Houston, TX (US); Jordan F. Teichman, Houston, TX (US); Chen Lin, Houston, TX (US); Bryan Paulet, Houston, TX (US); Behrouz Ebrahimi, Houston, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 123 days.

(21) Appl. No.: 15/643,769

(22) Filed: Jul. 7, 2017

(65) Prior Publication Data
US 2019/0012492 A1    Jan. 10, 2019

(51) Int. Cl.
*G06F 19/00* (2018.01)
*G06G 7/66* (2006.01)
(Continued)

(52) U.S. Cl.
CPC ........... *G06G 7/66* (2013.01); *G01R 33/0005* (2013.01); *G06G 7/122* (2013.01); *E21B 17/003* (2013.01);
(Continued)

(58) Field of Classification Search
CPC .... E21B 47/0008; E21B 43/126; E21B 47/00; E21B 43/121; E21B 43/127;
(Continued)

(56) References Cited

U.S. PATENT DOCUMENTS

| 4,603,592 A | 8/1986 | Siebold et al. |
|---|---|---|
| 4,631,954 A | 12/1986 | Mills |

(Continued)

FOREIGN PATENT DOCUMENTS

CN    203535446 U    4/2014

OTHER PUBLICATIONS

Takacs, G. et al., "Calculation of Gearbox Torques Considering Inertial Effects," Geosciences and Engineering, vol. 1, No. 1 (2012), pp. 283-291.

(Continued)

*Primary Examiner* — Kidest Bahta
(74) *Attorney, Agent, or Firm* — Blank Rome LLP

(57) ABSTRACT

A system and method handles one or more pumping units in an out-of-balance condition. Sensing equipment monitors operating parameters related to balance of each of the one or more pumping units. Processing equipment determines the out-of-balance condition in at least one of the one or more pumping units based on the monitored operating parameters. A first correction to a counterbalance parameter of the at least one pumping unit can be calculated, such as a new position or weight of the counterbalance, so the out-of-balance condition can be corrected by implementing the new position or weight at the at least one pumping unit. A second correction to a stroke parameter of the at least one pumping unit can be calculated, such as a new stroke rate or pattern, so operation of the pumping unit can be maintained despite the out-of-balance condition.

23 Claims, 10 Drawing Sheets

(51) Int. Cl.
*G06G 7/122* (2006.01)
*G01R 33/00* (2006.01)
*H04L 29/08* (2006.01)
*E21B 17/00* (2006.01)
*H04L 12/24* (2006.01)
*G01P 15/00* (2006.01)
*G01C 19/02* (2006.01)

(52) U.S. Cl.
CPC .............. *G01C 19/02* (2013.01); *G01P 15/00* (2013.01); *H04L 41/08* (2013.01); *H04L 67/12* (2013.01)

(58) Field of Classification Search
CPC ............. E21B 47/0006; E21B 47/0007; F02B 2075/027; F04B 2201/0201; F04B 2201/121; F04B 49/065; F04B 49/20; F04B 47/02; F04B 47/04; F04B 2201/0202; F04B 2205/05; F04B 47/022; F04B 47/026; F04B 53/1002; G01V 3/00
See application file for complete search history.

(56) References Cited

U.S. PATENT DOCUMENTS

| | | | |
|---|---|---|---|
| 4,660,426 A | 4/1987 | Mosley | |
| 5,180,289 A * | 1/1993 | Wenholz | F04B 47/028 417/53 |
| 5,761,085 A * | 6/1998 | Giorgio | G06F 1/206 361/679.4 |
| 6,144,924 A * | 11/2000 | Dowling | G01R 31/343 702/60 |
| 7,168,924 B2 * | 1/2007 | Beck | E21B 43/126 417/1 |
| 7,547,196 B2 | 6/2009 | Boyer et al. | |
| 9,033,676 B2 * | 5/2015 | Palka | E21B 43/127 417/44.1 |
| 2005/0238496 A1 | 10/2005 | Mills | |
| 2006/0119348 A1 | 6/2006 | Blossfeld | |
| 2009/0275805 A1 * | 11/2009 | Lane | A61B 5/01 600/300 |
| 2013/0151216 A1 * | 6/2013 | Palka | E21B 43/127 703/2 |
| 2018/0128264 A1 | 5/2018 | Robison et al. | |

OTHER PUBLICATIONS

Gibbs, S. G., "Computing Gearbox Torque and Motor Loading for Beam Pumping Units With Consideration of Inertia Effects." Society of Petroleum Engineers, SPE 5149-PA, Sep. 1, 1975, pp. 1153-1159.

Svinos, J. G., "Exact Kinematic Analysis of Pumping Units," Society of Petroleum Engineers, SPE 12201-MS, Jan. 1, 1983, 8-pgs.

Takacs, G., et al., "The calculation of gearbox torque components on sucker-rod pumping units using dynamometer card data," Journal of Petroleum Exploration and Production Technology, vol. 6, Issue 1, Mar. 2016, pp. 101-110.

LV, H. et al., "An Energy Saving System for a Beam Pumping Unit," Sensors 2016, 16, 685, May 13, 2016, 13-pgs.

* cited by examiner

SYSTEM AND METHOD FOR HANDLING PUMPING UNITS IN OUT-OF-BALANCE CONDITION

BACKGROUND OF THE DISCLOSURE

Reciprocating pump systems, such as sucker rod pump systems, extract fluids from a well and employ a downhole pump connected to a driving source at the surface. A rod string connects the surface driving force to the downhole pump in the well. When operated, the driving source cyclically raises and lowers the downhole pump, and with each stroke, the downhole pump lifts well fluids toward the surface.

For example, FIG. 1 shows a sucker rod pump system 10 used to produce fluid from a well. A downhole pump 14 has a barrel 16 with a standing valve 24 located at the bottom. The standing valve 24 allows fluid to enter from the wellbore, but does not allow the fluid to leave. Inside the pump barrel 16, a plunger 20 has a traveling valve 22 located at the top. The traveling valve 22 allows fluid to move from below the plunger 20 to the production tubing 18 above, but does not allow fluid to return from the tubing 18 to the pump barrel 16 below the plunger 20. A driving source (e.g., a pump jack or pumping unit 11) at the surface connects by a rod string 12 to the plunger 20 and moves the plunger 20 up and down cyclically in upstrokes and downstrokes.

During the upstroke, the traveling valve 22 is closed, and any fluid above the plunger 20 in the production tubing 18 is lifted towards the surface. Meanwhile, the standing valve 24 opens and allows fluid to enter the pump barrel 16 from the wellbore.

At the top of stroke, the standing valve 24 closes and holds in the fluid that has entered the pump barrel 16. Furthermore, throughout the upstroke, the weight of the fluid in the production tubing 18 is supported by the traveling valve 22 in the plunger 20 and, therefore, also by the rod string 12, which causes the rod string 12 to stretch. During the downstroke, the traveling valve opens, which results in a rapid decrease in the load on the rod string 12. The movement of the plunger 20 from a transfer point to the bottom of stroke is known as the "fluid stroke" and is a measure of the amount of fluid lifted by the pump 14 on each stroke.

Because there are no sensors to measure conditions at the downhole pump 14, which may be located thousands of feet underground, surface measurements of the position and load for the rod string 12 at the pump jack 11 are used with numerical methods to calculate the position of the pump plunger 20 and the load acting on the plunger 20. These surface measurements are typically made at the top of the polished rod 15, which is a portion of the rod string 12 passing through a stuffing box 13 at the wellhead. A pump controller 26 is used for monitoring and controlling the pump system 10.

To efficiently control the reciprocating pump system 10 and avoid costly maintenance, the rod pump controller 26 can gather system data and adjust operating parameters of the system 10 accordingly. Typically, the rod pump controller 26 gathers system data such as load and rod string displacement by measuring these properties at the surface.

Current pumping units, such as the pump jack 11, are counterbalanced to reduce the energy consumption. The counterbalance subsystem uses weights 36 attached at predetermined points along crank arms 34 to offset a portion of the rod load in the well. The position of these weights 36 is normally calculated as a part of the initial setup and is based upon numerous factors including, but not limited to, the physical characteristics (length, weight, etc.) of the rod string 12, the fluid load, the size of the pumping unit 11, the type of gearbox 32, the type of motor 30, etc. The calculations involved in setting up the weight's position have been known for many years by those skilled in the art of conventional pumping units.

During the course of normal pumping operations, however, the rod loads may change. This results in a condition known as "out-of-balance," and it is desirable to correct this condition. Otherwise, the energy usage increases, and the operation of the pumping unit 10 is not optimal, which can reduce the operating life of some of the components.

For many years, operators have inserted an electrical meter, such as an ammeter or tachometer, across terminals of the motor 30 of the unit 100 as a means of determining the severity of the "out-of-balance" condition. For example, the ammeter can directly measure the peak current on the upstroke and the downstroke. Once the measurement is taken, a calculation is made to determine what the new placement of the counterbalance weights 36 should be. However, in most cases, installing the ammeter or tachometer requires a high voltage electrical cabinet to be opened so leads of the meter can be attached to the motor terminals. This is not a desired practice.

The subject matter of the present disclosure is directed to overcoming, or at least reducing the effects of, one or more of the problems set forth above.

SUMMARY OF THE DISCLOSURE

According to the present disclosure, a method and a system are used for handling one or more pumping units in an out-of-balance condition. Operating parameters of each of the one or more pumping units are monitored with sensing equipment. The operating parameters are related to balance of the one or more pumping units. Processing equipment determines the out-of-balance condition of at least one of the one or more pumping units based on the monitored operating parameters.

The processing unit calculates at least one of a first correction to a counterbalance parameter of the at least one pumping unit and a second correction to a stroke parameter of the at least one pumping unit. The counterbalance parameter to be corrected can include a new position and/or a new amount of the counterbalance weight of the pumping unit. The stroke parameter to be corrected can include a new stroke rate and/or pattern of the pumping unit. The out-of-balance condition is then countered by implementing at least one of the first and second corrections at the at least one pumping unit.

Monitoring the operating parameters with sensing equipment can involve permanently or temporarily installing the sensing equipment on the at least one pumping unit. The operating parameters that can be monitored can include surface load and at least one of surface position and crank angle.

To determine the out-of-balance condition of the at least one pumping unit based on the monitored operating parameters, a first peak of a net gearbox torque on an upstroke of the at least one pumping unit can be determined to be less or more than a second peak of the net gearbox torque on a downstroke.

The method and system can obtain, with the processing equipment, at least one control to implement the at least one of the first and second corrections. The at least one control can be obtained/received/selected directly at a local interface of the processing equipment at the at least one pumping unit. Alternatively, the at least one control can be obtained/received/selected directly at a remote interface of the processing equipment and can be relayed to a local interface of the processing equipment at the at least one pumping unit. The at least one control can be selected automatically by the processing equipment based on available information comparing the first and second corrections to one another.

The first correction to the counterbalance parameter may only be calculated in response to obtaining a first of the at least one control, whereas the second correction to the stroke parameter may only be calculated in response to obtaining a second of the at least one control. Alternatively, both the first and second corrections can be calculated regardless. In fact, the calculations of the first and/or second corrections can be performed before obtaining the at least one control to implement. Results of the calculations of the corrections can be using in an automated selection of the control or can be presented in a user interface as part of obtaining a user's selection of the control.

To calculate the first correction to the counterbalance parameter of the at least one pumping unit, a position of a counterweight of the at least one pumping unit can be determined as the first correction by adjusting a counterbalance torque relative to a rod torque and inertial torques of the at least one pumping unit under the operating parameters. Countering the out-of-balance condition in this instance can involve implementing the first correction at the at least one pumping unit by adjusting the counterweight of the at least one pumping unit to the determined position.

To calculate the second correction to the stroke parameter of the at least one pumping unit, at least one of a pumping speed (stroke rate) and a pumping pattern (stroke pattern) can be determined as the second correction using a torque factor and torque components of the at least one pumping unit. Countering the out-of-balance condition in this instance can involve implementing the second correction at the at least one pumping unit by adjusting an actuator of the at least one pumping unit with the at least one of the pumping speed and pumping pattern.

A system for handling a plurality of pumping units in an out-of-balance condition can include sensing equipment, processing equipment, and communication equipment. The sensing equipment can include one or more of a removable assembly, a permanent assembly, an orientation sensor, a magnetometer, a velocity sensor, a gyrometer, an acceleration sensor, and an accelerometer. The sensing equipment monitors operating parameters of each of the pumping units. The operating parameters are related to balance of the one or more pumping units.

The processing equipment is in communication with the sensing equipment and can include one or more of a portable device, a local control unit, a remote control unit, and a server system. The processing equipment is configured to determine the out-of-balance condition in at least one of the pumping units based on the monitored operating parameters. With the out-of-balance condition determined, the processing equipment calculates at least one of a first correction to a counterbalance parameter of the at least one pumping unit to counter the out-of-balance condition, and a second correction to a stroke parameter of the at least one pumping unit to counter the out-of-balance condition.

The communication equipment is in communication with the processing equipment and can include one or more of a wireless interface, a wired interface, and a user interface of the processing equipment. The communication equipment communicates information for implementing at least one of the first and second corrections at the at least one pumping unit to counter the out-of-balance condition. The communication equipment can obtain at least one control to implement the at least one of the first and second corrections, and the processing equipment is configured to calculate at least one of the first and second corrections in response to the at least one control obtained.

According to the present disclosure, a method and a system are used for rebalancing a pumping unit in an out-of-balance condition. Sensing equipment monitors operating parameters of the pumping unit that are related to balance of the pumping unit. Processing equipment determines the out-of-balance condition of the pumping unit based on the monitored operating parameters.

With the out-of-balance condition determined, the processing equipment seeks to rebalance the pumping unit. To do this, the processing equipment obtains input of the operating parameters for a plurality of strokes of the pumping unit. The processing equipment computes torque components of the pumping unit from the obtained input and determines a new counterbalance parameter of the pumping unit from the computed torque components. The out-of-balance condition of the pumping unit is then corrected by changing a counterbalance of the pumping unit based on the determined counterbalance parameter.

To determine the new counterbalance parameter of the pumping unit from the computed torque components, the processing equipment can assume that rod and inertial torques are fixed and can balance patterns and peaks of up and down strokes of the pumping unit. A new position of a counterweight of the pumping unit can be determined so the counterbalance of the pumping unit can be changed to the new determined position.

To ensure operation, a net gearbox torque of the pumping unit can be recalculated based on the determined new position. In this way, any over-loading of the pumping unit can be verified by comparing a condition of the pumping unit with the recalculated net gearbox torque against surface data of the pumping unit.

According to the present disclosure, a method and a system are used for modifying operation of a pumping unit in an out-of-balance condition. Sensing equipment monitors operating parameters related to balance of the pumping unit. Processing equipment determines the out-of-balance condition of the pumping unit based on the monitored operating parameters.

With the out-of-balance condition determined, the processing equipment seeks to modify the pumping unit's operation. To do this, the processing equipment obtains input of the operating parameters from the sensing equipment for a plurality of strokes of the pumping unit at a plurality of stroke rates. The processing equipment computes existing torque components of the pumping unit from the obtained input and determines a new stroke parameter (i.e., new stroke rate and/or new stroke pattern) of the pumping unit from the computed torque components. The out-of-balance condition of the pumping unit is then countered by changing the pumping unit to the determined new stroke parameter. To ensure operation, the processing equipment can verify that any peaks of a net gearbox torque are within a gearbox rating of the pumping unit.

The foregoing summary is not intended to summarize each potential embodiment or every aspect of the present disclosure.

DETAILED DESCRIPTION OF THE DISCLOSURE

Figure 1:
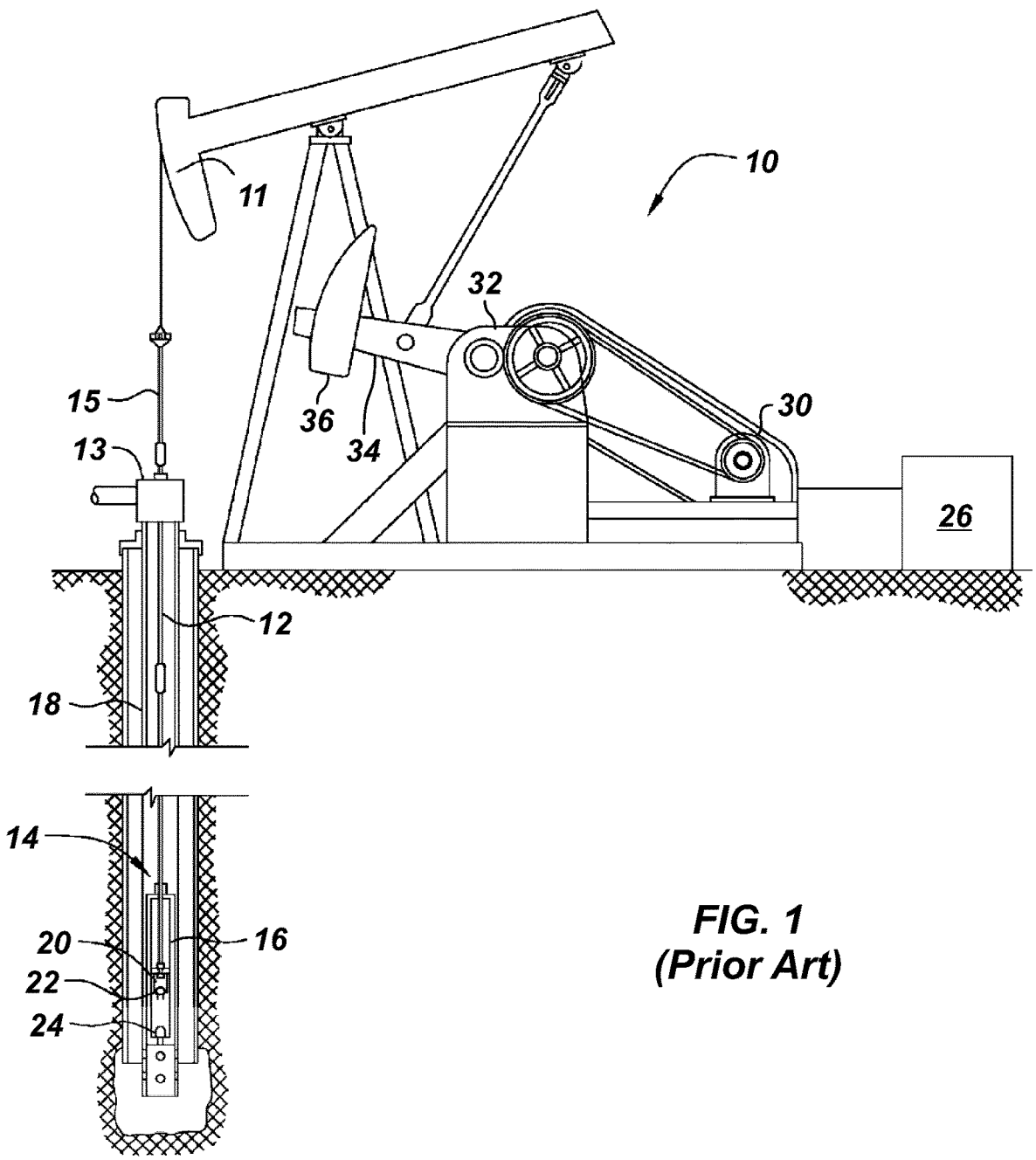
FIG. 1 illustrates an example of a reciprocating rod pump system known in the art.
Figure 2:
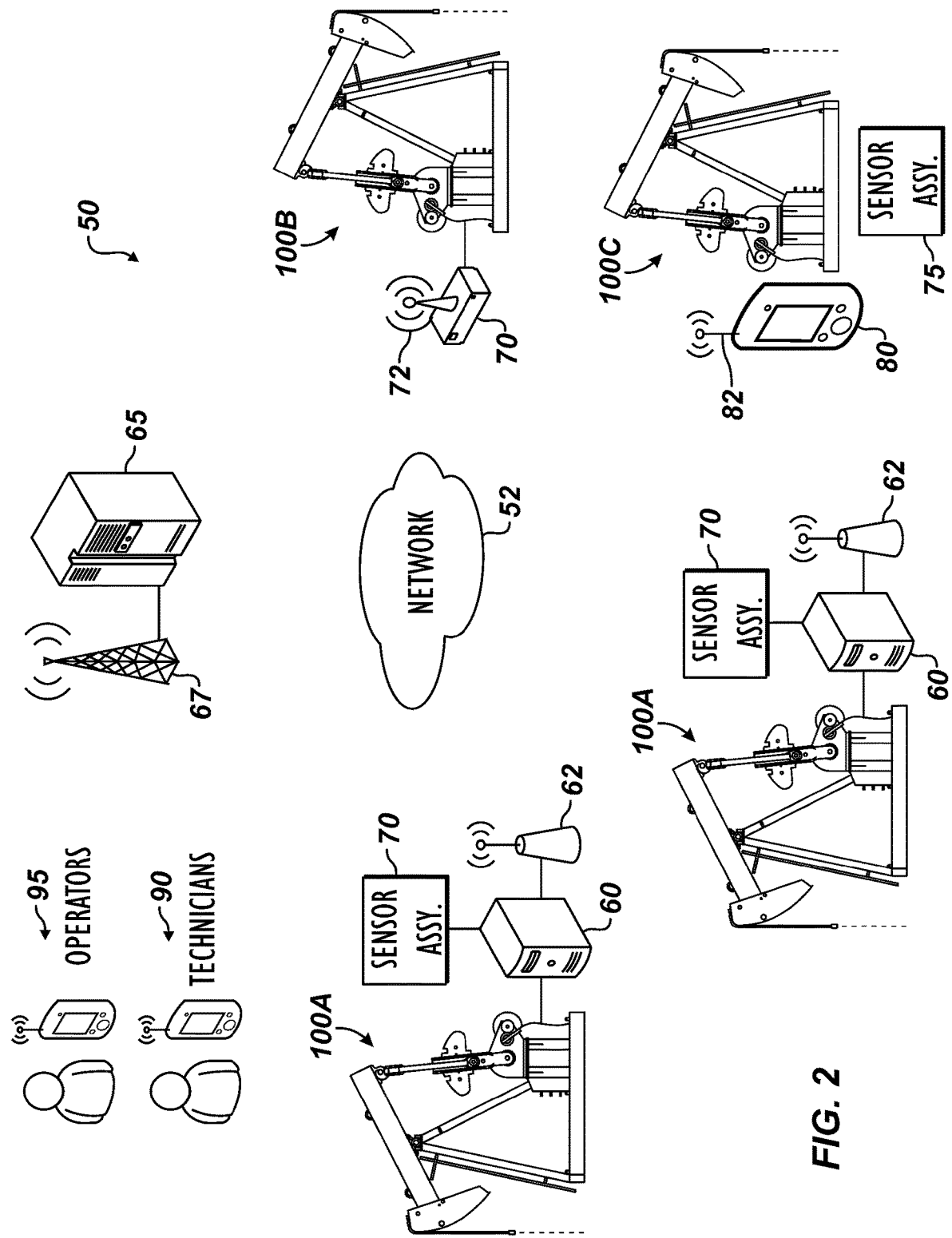
FIG. 2 illustrates a system according to the present disclosure for monitoring several reciprocating rod pump systems.

Referring to FIG. 2, a system 50 monitors several reciprocating rod pumping units 100 of the present disclosure at various locations to improve the operations of the various unit 100. As will be appreciated, the pumping units 100 installed at different wells may have different capacities, operating requirements, maintenance schedules, life spans, etc. In fact, the pumping units 100 may be serviced by different technicians 90 and may be operated by different operators 95.

The monitoring system 50 helps deal will all of these differences by integrating sensing, monitoring, and control of the pumping units 100. To do this, the monitoring system 50 includes one or more: local control units 60, server system 65, installed sensor assemblies 70, portable control units 80, and removable sensor assemblies 75. Each of the various local control units 60, server system 65, installed sensor assemblies 70, portable control units 80, and the like has communication components 62, 67, 72, 82, etc. for communicating information (signals, measurements, controls, user interface screens, graphs, etc.) locally to users and remotely over one or more communication networks 52, which can be wired, wireless, satellite, cellular, or other form of network.

The communicated information can be shared among the elements of the system 50. For example, the communicated information can be communicated directly with the technicians 90 and operators 95 or communicated with the service system 65 for access by the technicians 90 and operators 95. For example, a pumping unit 100 having an installed sensor assembly 70 can communicate directly with the technicians 90 and operators 95, can communicate with the server system 65, and/or can communicate with another pumping unit 100 having a local control unit 60. As will be appreciated, these and any number of possible communication arrangements can be used.

One type of pumping unit 100A having a local control unit 60 can have an installed sensor assembly 70 to monitor operation of the pumping unit 100A. Some of the operational monitoring provided by the control unit 60 can include typical operating instructions, measurements, and other details related to common operation of the pumping unit 100A. However, according to the present disclosure, the local control unit 60 further includes features allowing the pumping unit 100A to be monitored for imbalanced conditions so proactive steps can be taken to rebalance the unit 100A or to alter its operation to account for the imbalance at least temporarily. The local control unit 60 can use its communication equipment 62 to communicate the monitored imbalance and can receive instructions remotely or locally to handle the condition.

Another type of pumping unit 100B may have an installed sensor assembly 70 to monitor operation of the pumping unit 100B. Although the unit 100B may have a conventional controller for its typical operation, the unit 100B may not include a local control unit 60 that includes specific features allowing the pumping unit 100B to be monitored for imbalanced conditions so proactive steps can be taken to rebalance the unit 100B or to alter its operation to account for the imbalance at least temporarily. Instead, the installed sensor assembly 70 can use its communication equipment 72 to communicate the monitored conditions and can receive instructions remotely or locally.

Yet another type of pumping unit 100C may not have an installed sensor assembly 70 and may not include a local control unit 60. Instead, a portable control unit 80 and a removable sensor assembly 75 can be used on the pumping unit 100C. The portable control unit 80 and sensor assembly 75 include features to monitor for imbalanced conditions so proactive steps can be taken to rebalance the unit 100C or to alter its operation to account for the imbalance at least temporarily. The portable control unit 80 can use its communication equipment 82 to send information and receive instructions remotely or locally.

Although three types of pumping units 100A-C are shown, it will be appreciated that a given pump unit 100 as part of the disclosed system 50 can have other configurations of the salient components disclosed herein with more or less autonomous and manual capabilities.

During operation, one of the pumping units 100A-C may become imbalanced. Depending on the configuration of the unit 100A-C, the imbalanced condition may be communicated remotely or may only be available locally. For example, some types of the pumping units 100A-B can determine and communicate the imbalance on their own. The imbalance condition can be communicated to the technicians 90, operators 95, server system 65, other unit 100, etc. Other types of units 100C may only determine and communicate the imbalance when locally serviced using a portable control unit 80 and removable sensor assembly 75.

Either way, technicians and operators 90 and 95 can be informed of the imbalanced condition through the system 50. Ideally, the imbalanced pumping unit 100A-C can be quickly serviced to correct the imbalance. For example, the counterweights of the unit 100A-C can be repositioned for balance. Usually, operators 90 may know that the unit 100A-C is imbalanced but service has not been scheduled or technicians 95 cannot service the unit 100A-C at the time or not until some extended period of time later.

The monitoring system 50 allows the imbalance of the pumping unit 100A-C to be dealt with when any of these various situations occur. In one option, the monitoring system 50 allows the given pumping unit 100A-C to be rebalanced by monitoring parameters, performing calculations, determining balance conditions, and providing output for rebalancing the unit 100A-C. In another option, the monitoring system 50 allows the given pumping unit 100A-C to continue operation even though imbalanced by monitoring parameters, performing calculations, and providing output for modifying operating conditions of the unit 100A-C to maintain safety and minimize production losses.

As can be seen, the pumping units 100A-C can have different configurations, generally characterized as a walk-up installation (e.g., unit 100C), a permanent installation (e.g., 100A), and some intermediate installation (e.g., unit 100B) therebetween.

The permanent installation (e.g., unit 100A) applies the teachings of the present disclosure using a local control unit 60 and an installed sensor assembly 70. Sensors of the assembly 70 are permanently installed on the pumping unit 100. Sensor data is periodically collected by the local control unit 60 for safe long term storage. The control unit 60 can be used to manage the calculations automatically and to provide remote indication of the counterbalance condition. Users (i.e. technicians 90 and operators 95) can use a mobile device in the field to connect to the local control unit 60 and can benefit from all the local operations available for the walkup installation. Users can download data history and can perform other functions. The local control unit 60 can connect to the network 52 (i.e., cloud) directly for access by the users, to upload history to a web application, etc. The uploaded data can further be used for advanced data analytics.

The local control unit 60 can be part of or can interface with an existing control system of the pumping unit 100. An example of such an existing control system is a Weatherford Wellpilot system. Should a maintain option be switched on, the user or the control unit 60 can automatically set a pumping speed to ensure the gearbox will not be overloaded and the loss of production due to the out of balance condition minimized. Should the control system include a variable frequency drive, such as a Weatherford VFD, to provide continuously variable speed control, the user or the control unit 60 can automatically access a speed pattern appropriate to ensure the above operation.

The walk-up installation (e.g., unit 100C) applies the teachings of the present disclosure using a removable or walk-up sensor assembly 75. In this scenario, the sensor assembly 75 can be used to measure the rod load and the crank arm position and can transmit the measured data to a portable control unit 80 (e.g., a tablet PC or the like) having software application that implements the necessary calculations to determine the imbalanced condition.

In either case, the sensor assembly 70, 75 uses a sensor package to measure rod load and the rotation angle of the crank arm on the pumping unit 100. This information is then used to calculate an optimal position and weight of the unit's counterbalance. A graphical representation of the calculated results can then be displayed on the control unit 60, 80. The results of the calculations may be stored on the control unit 60, 80. Also, the data in the control unit 60, 80 can be synchronized to a cloud-based server system 65 and can be visualized by a web application.

Two options for control may be given to a user or may be automatically selected by the system 50. The user or system 50 can select an option to rebalance the pumping unit 100. Here, the control unit 60, 80 uses the sensor data and determines a new suggestion for the position of the counterbalance weight to be displayed for the user or to be stored for later implementation. The control unit 60, 80 can communicate the required steps for the user to balance the unit 100.

A second option can be selected by the user or the system 50 to maintain safe operation of the pumping unit 100. For example, the technician 90 or operator 95 may be unable at present to change the counterbalance weight's position to the optimum location on the crank arm. Therefore, a control strategy can instead be used to change the pumping speed (stroke rate) and/or the speed pattern (stroke pattern) of the unit 100 to minimize damage to the rotating components and to minimize production losses the system would otherwise incur. Using the sensor data, for example, the control unit 60, 80 determines a new pumping speed (e.g., new stroke rate) to be suggested to the user, stored for later implementation, or directly implemented so the pumping unit 100 can be in better balance, the gearbox will not be overloaded, and the loss of production due to the out-of-balance condition minimized. In another example, the control unit 60, 80 can determines a new pumping pattern (e.g., the upstroke being different in magnitude, duration, rate, etc. from the downstroke or vice versa) to be suggested to the user, stored for later implementation, or directly implemented so the pumping unit 100 can be in better balance, the gearbox will not be overloaded, and the loss of production due to the out-of-balance condition minimized.

Various details of these options and the steps involved are discussed later. First, discussion turns to some particular details of a pumping unit 100, sensor assembly 70, 75, and other components of the monitoring system 50.

In general, the pumping unit 100 can be a pump jack as shown herein, but other types of pumping units 100 may also suffer from comparable forms of imbalance suited for monitoring and handling according to the present disclosure.

Figure 3A:
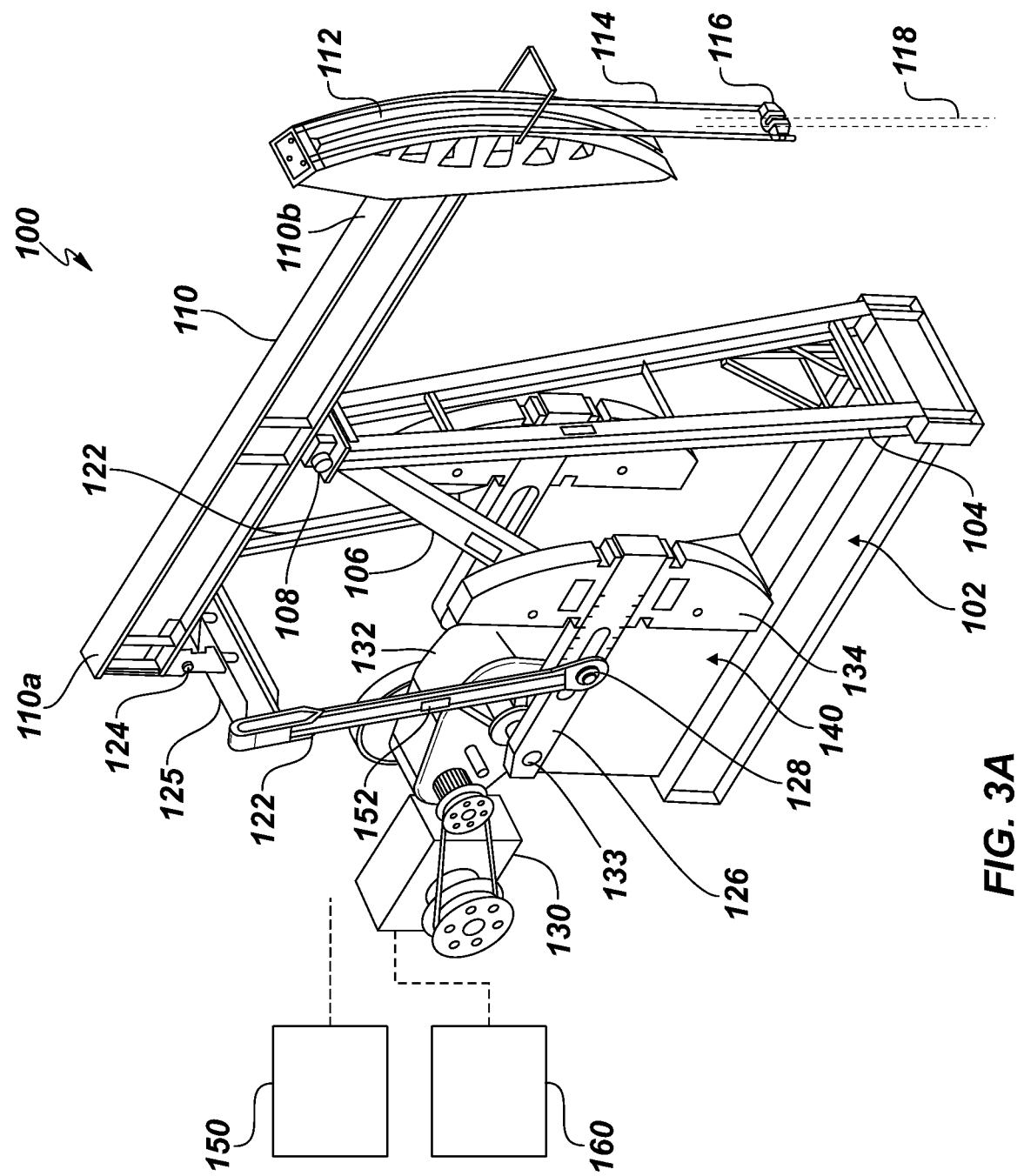
FIG. 3A illustrates a perspective view of a pumping unit having a counterweight balancing assembly according to the present disclosure.

Referring now to FIG. 3A, a pumping unit 100 according to the present disclosure includes a frame 102, a walking beam 110 disposed on the frame 102, a crank assembly 120 connected to the walking beam 110, and an actuator 130 connected to the crank assembly 120. A polished rod 118 for a reciprocating rod system connects to a head 112 of the walking beam 110 using wireline 114 and a polished rod hanger 116.

The frame 102 is installed on a pumping unit base and may include one or more front posts 104 and one or more back post 106 joined together forming an A-frame to support the walking beam 110, which is pivotably supported by a bearing assembly 108.

The crank assembly 120 includes pitman arms 122 coupled to one end 110a of the walking beam 110 by a tail or equalizer bearing assembly 124. As shown, the pumping unit 100 may have two pitman arms 122 joined by an equalizer beam 125, which is connected to the walking beam 110 by the bearing assembly 124. Each pitman arm 122 is pivotably connected to a crank arm 126 by a crank pin assembly 128, also called a wrist pin.

The actuator 130 primarily includes an electric motor that rotates the crank arms 126. Typically, a gearbox 132 is connected to the motor 130 and reduces the motor's rotation to a crankshaft 133 connected to the crank arms 126. For counterbalance as discussed herein, one or more counterweight blocks 134 may be attached to the crank arms 126.

As the actuator 130 rotates the crank assembly 120, the walking beam 110 seesaws on the frame's pivot 108 so the polished rod 118 reciprocates the rod system and downhole pump in the well. During operation, for example, the motor 130 and gearbox 132 rotates the crank arms 126, which causes the end 110a of the walking beam 110 to move up and down through the pitman arms 122. Up and down movement of the end 110a causes the walking beam 110 to pivot about the bearing assembly 108 resulting in downstroke and upstroke of the horse head 112.

During an upstroke, the motor 130 and gearbox 132 aided by the counterbalance weights 134 overcomes the weight and load on the horse head 112 and pulls the polished rod string 118 up from the wellbore, which reciprocates the rod string and downhole pump in the well to lift fluid. During a downstroke, the motor 130 aided by the weight and load on the horsehead 112 rotates the crank arms 126 to raise the counterbalance weights 134.

The counterbalance weight 134 is selected based on the weight and load of the reciprocating rod system (i.e., the force required to lift the reciprocating rod and fluid above the downhole pump in the wellbore). In one embodiment, the counterbalance weight 134 may be selected so that one or more components of the pumping unit 100 have substantially symmetrical acceleration and/or velocity during upstrokes and downstrokes. The component may be any moving part of the pumping unit 100, such as the pitman arm 122, the wrist pin assembly 128, the crank arm 126, the equalizer beam 125, the walking beam 110, the horse head 112, etc.

According to the present disclosure, the pumping unit 100 includes a management assembly 140 for balancing/adjusting the pumping unit 100. As noted, the management assembly 140 can be part of or incorporated into the pumping unit 100, can include local components and remote components, and can have other configurations as noted herein.

The management assembly 140 includes mechanically-adjustable components on the pumping unit 100 to adjust the position of the counterweights 134 on the crank arms 132 and/or change the wrist pin's location connecting the pitman arms 122 to the crank arms 126, which changes the balance of the unit 100. Details related to such mechanically-adjustable components can be found in co-pending U.S. application Ser. No. 15/345,288, filed 7 Nov. 2016 and entitled "Apparatus and Methods for Counterbalancing a Pumping Unit," which is incorporated herein by reference in its entirety.

As shown here, the management assembly 140 further includes a sensor assembly 150 and a control unit 160 for balancing/adjusting the pumping unit 100. The sensor assembly 150 can be a permanent or a removable assembly 70, 75 as discussed previously. In terms of the system 50 of FIG. 2, the control unit 160 can be a local control unit (60), a remote control unit (80), part of a server system (65), etc.

The sensor assembly 150 has one or more sensors 152 that are attached to one or more moving components of the pumping unit 100. The sensors 152 measure one or more parameters related to an imbalance between the loads from the polished rod string 118 and the counterbalance weight 134. The one or more parameters may include at least one of velocity and acceleration of the moving component(s) and may include orientation of the counterbalance weight 134.

Even though a sensor 152 is shown in FIG. 3A attached at one position on the pumping unit 100, it will be appreciated that various types of sensors, such as sensors for orientation, velocity, acceleration, etc., may be attached at different positions on the pumping unit 100. In general, the sensors 152 of the assembly 150 may be attached to any of a number of components on the unit 100, and the sensors 152 can be arranged on several components. For example, the sensors 152 may be attached to the pitman arm 122 to measure at least one of velocity and acceleration of the pitman arm 122 and may measure the orientation of the counterbalance weight 134. The sensors 152 may be attached to the pitman arm 122 near the wrist pin assembly 128 so the sensor assembly 150 may measure velocity and/or acceleration of the counterbalance weight 134. Alternatively, the sensors 152 may be attached to the walking beam 110 or the horsehead 112 to measure the acceleration and/or velocity of the walking beam 110 or the horsehead 112. These and other configurations are possible.

During operations, the sensor assembly 150 may send measurements to the control unit 160 via wired, wireless, satellite, cellular, or other form of communication. For its part, the control unit 160 include computer programs for analyzing the measurements from the sensor assembly 150 and providing various forms of output. In particular, the control unit 160 may determine imbalance of the counterbalance weight 134 based on the measurements from the sensor assembly 150 and may provide balancing solutions, such as providing adjustment to balance the pumping unit 100.

Figure 3B:
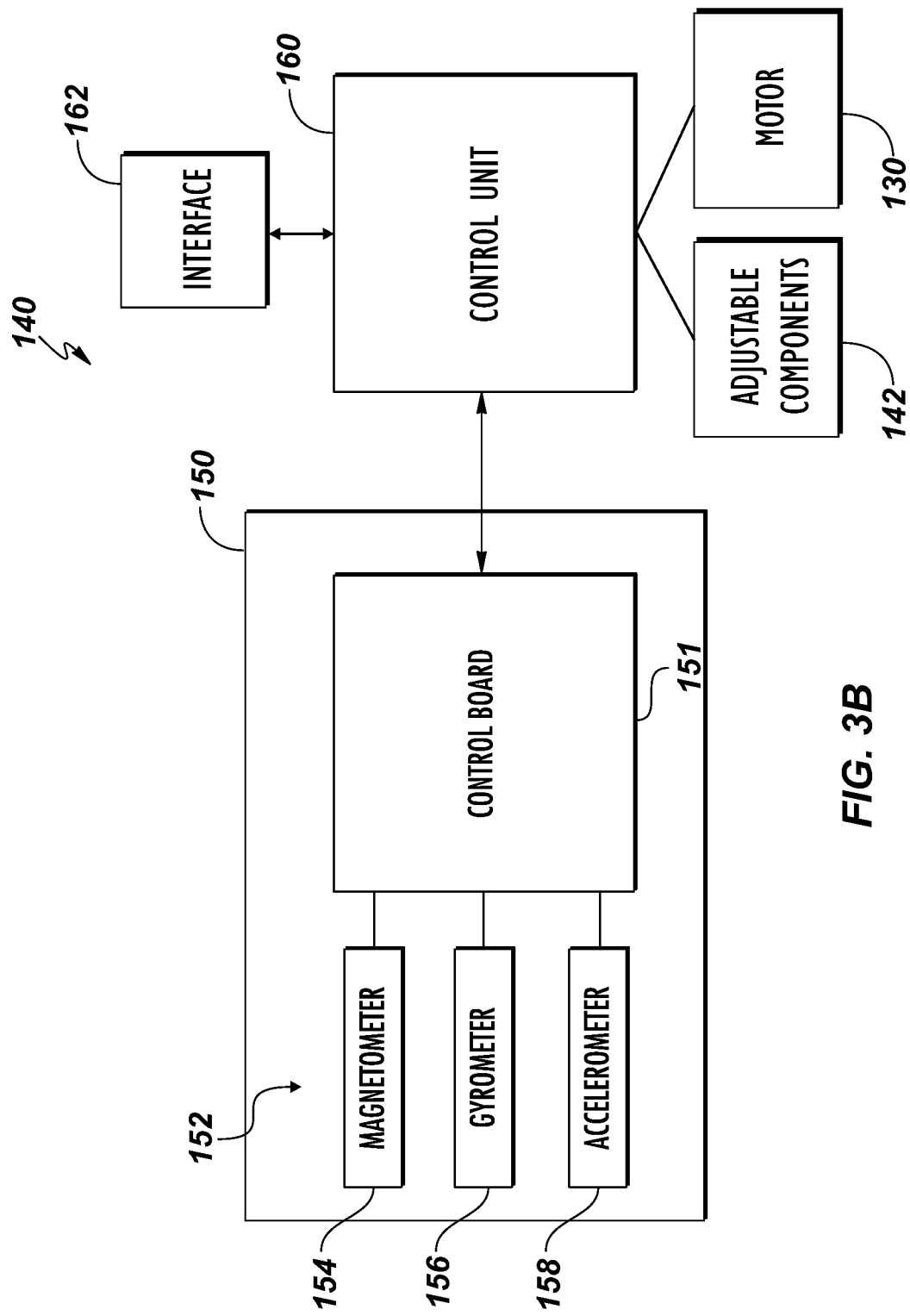
FIG. 3B illustrates a schematic diagram of a sensor assembly and controller for the pumping unit of FIG. 3A.

With an understanding of the pumping unit 100, discussion turns to FIG. 3B, which schematically diagrams the elements of the monitoring assembly 140 according to one embodiment of the present disclosure. Again, the monitoring assembly 140 includes the sensor assembly 150 and the control unit 160.

The sensors 152 may include an orientation sensor 154 for measuring orientation, such as the orientation of the counterbalance weight (134). In one embodiment, the orientation sensor 154 may be a magnetometer, which is useful to describe the orientation of the element it is attached to in the earth's magnetic field. Furthermore, it could provide information on the placement or position of the counterbalance weight (134) in relationship to the element to which the sensor 154 is attached.

The sensors 152 may include a velocity sensor 156, which may be a gyrometer, such as a 3-axis gyrometer, although the velocity sensor 156 may be any suitable sensor for measuring velocity. The sensors 152 may include an acceleration sensor 158, which may be an accelerometer, such as a 3-axis accelerometer, although the acceleration sensor 158 may be any sensors suitable for measuring acceleration.

Even though both the velocity sensor 156 and the acceleration sensor 158 are shown in FIG. 3B, the sensor assembly 150 may include only one of the velocity sensor 156 and the acceleration sensor 158, and it may also be configured to only sense the velocity or acceleration in one axis.

The sensor assembly 150 may further include a control board 151 connected to the sensors 152. The control board 151 may include input/output ports to connect with the sensors 152. The control board 151 may establish a wired or a wireless communication with the control unit 160.

The sensor assembly 150 can be permanently mounted on the pumping unit 100 or can be a portable assembly to be installed and removed as necessary on a given unit. In one embodiment, the sensor assembly 150 may include a hermetic housing that encloses the sensors 152 and the control board 151 therein. The sensor assembly 150 may further include structures to permit secure attachment of the sensor assembly 150 to a moving component of the pumping unit 100.

Just as the sensor assembly 150 can be permanent or portable, the control unit 160 may also be permanent or portable. For example, the control unit 160 may be a computer or a mobile device, such as a smart phone or a tablet. The control unit 160 may be incorporated into the overall control system of the pumping unit (100) as a permanent element, or the control unit 160 may be a portable or remote component that interfaces with the pumping unit (100). The control unit 160 may include one or more interfaces 162, such as user interface, a display, communication equipment, etc., and may include computer programs or an application for analyzing measurements from the sensor assembly 150, detecting a balance condition, such as any imbalance, in the pumping unit (100), and/or providing a solution to balance/adjust the pumping unit (100).

In providing a solution to balance/adjust the pumping unit (100), the control unit 160 can provide adjustment(s) for the mechanically-adjustable components 142 of the assembly 140. For example, the control unit 160 may include a program for displaying a graphical representation of the motion of the pumping unit (100) and may indicate an adjustment of the counterbalance weight (134) to achieve balance. In most cases, the adjustment to the counterbalance weight (134) may involve moving the weight on the crank arm (126) to a new position, but may involve adding or removing weight. In most cases, these adjustments must be done manually by technicians. In the event the pumping unit (100) has the capability, the adjustment to the counterbalance weight (134) or other counterbalance parameters can be done automatically using movable weights or the like. In providing a solution to balance/adjust the pumping unit (100), the control unit 160 can provide adjustment(s) to the motor 130 of the pumping unit (100). Details of these solutions will now be discussed.

Figure 4:
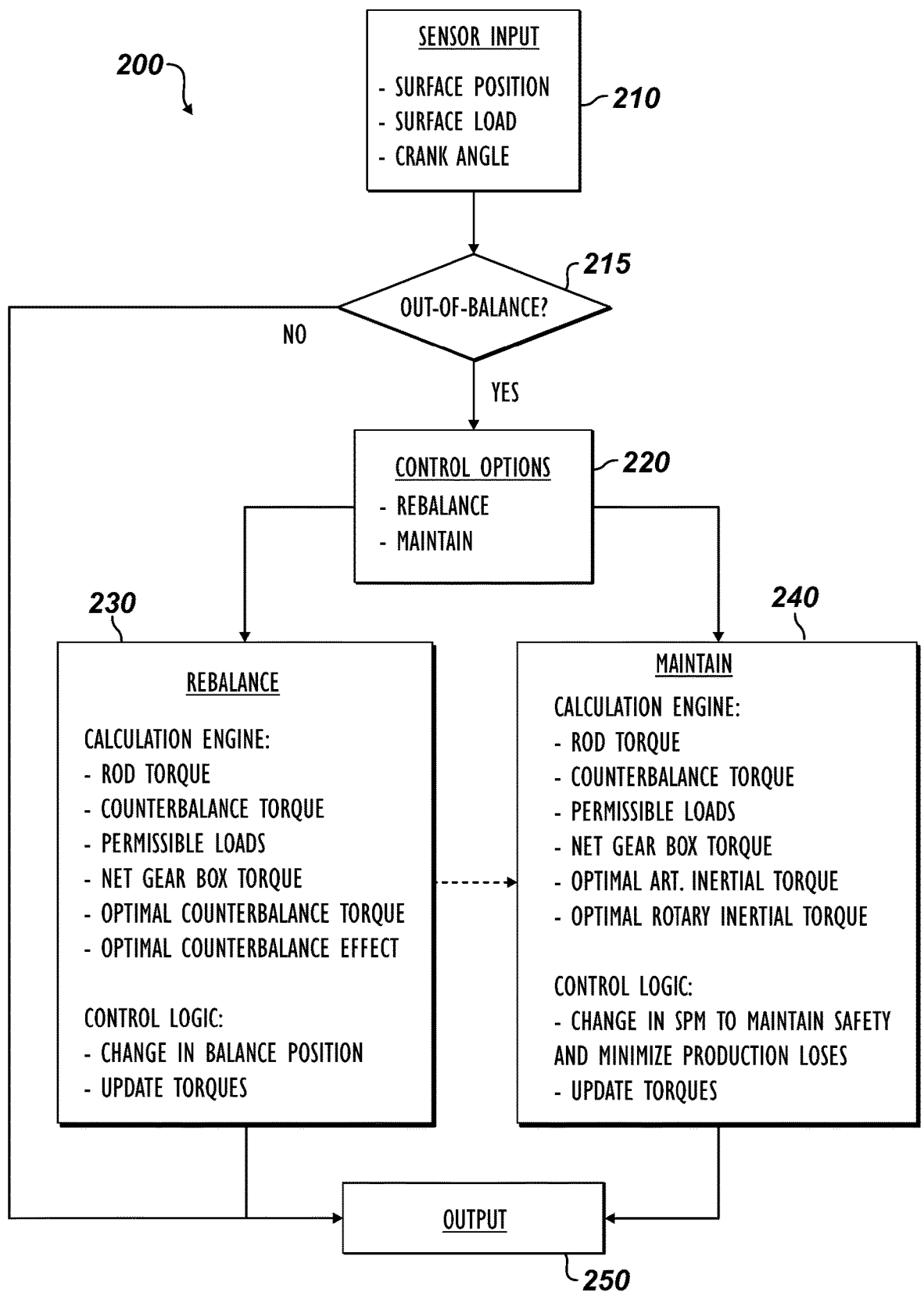
FIG. 4 illustrates a control process for the disclosed monitoring system.

FIG. 4 illustrates an overall monitoring process 200 performed by the monitoring system of the present disclosure (i.e., by one or more of the salient components of the system 50 in FIG. 2 or the assembly 140 in FIGS. 3A-3B). The process 200 begins by receiving sensor input, such as surface position, surface load, crank angle, and the like from the sensor assembly 150 (Block 210). One or more of these inputs may need to be calculated using other sensor inputs depending on the sensor configuration available at the given pumping unit 100.

Using the sensor inputs, the process 200 determines whether the pumping unit 100 is out-of-balance (Decision 215). This involves looking at the net gearbox torque of the pumping unit 100 in the upstroke and the downstroke. If the net gearbox torque peak on the upstroke is within a certain tolerance of the net gearbox torque peak on the downstroke, then the pumping unit 100 can be considered to be in-balance. Otherwise, the pumping unit 100 can be considered out-of-balance. The particular tolerance between the peaks used for the comparison can depend on the particular pumping unit, the torque values involved, user-defined variables, and a number of factors. In general, the tolerance can be 10-amps when using an ammeter, which can be correlated to torque values.

Being out-of-balance can correspond to being under or over-balanced. If the net gearbox torque peak on the upstroke is less than that on the downstroke (i.e., the maximum net gearbox torque or peak torque occurs during the downstroke), for example, then the pumping unit 100 is considered to be overbalanced or counterweights-heavy. Similarly, if the net gearbox torque on the downstroke is less than that on the upstroke (i.e., the peak torque occurs on the upstroke), for example, then the unit 100 is said to be underbalanced or rod-heavy.

If the pumping unit 100 is out-of-balance (Yes at Decision 215), the process 200 can offer at least two control options as hinted to herein (Block 220). A first control option ("Rebalance") allows the given pumping unit 100 to be rebalanced to correct the out-of-balance condition. This rebalance option calculates an optimum position of the counterbalance weights 134 based on the current net gearbox torque. The counterbalance weight 134 can then be adjusted accordingly. In other arrangements, the rebalance option can calculate adjustments to other adjustable components.

A second control option ("Maintain") allows operation of the given pumping unit 100 to be maintained even though it is in an out-of-balance condition. This maintain option seeks to maintain efficiency of the pumping unit 100 and maximize the resulting production despite the out-of-balance condition. To do this, the maintain option modifies a speed parameter (namely, a stroke rate or strokes-per-minute) of the pumping unit 100 so that the sum of the rod torque and the inertial components matches the counterbalance torque within tolerable limits. This rebalanced condition may stay in effect for the pumping unit 100 at least until rebalancing of the unit 100 is possible or some other intervening operation is performed.

Some details of the rebalance control option are listed in Block 230, while some details of the maintain control option are listed in Block 240. Although these control options 230, 240 may be mutually exclusive with only one or the other being performed, it may be desirable for the calculations and determinations of both control options to be performed for a given pumping unit 100 in an out-of-balanced condition. For instance, even though the maintain control option 240 may be selected for the given pumping unit 100, the details of the rebalance control option 230 may be determined so the pumping unit 100 can eventually be rebalanced after operating in the maintain option 240 for a period of time. This can be advantageous when the pumping unit 100 is determined to be out-of-balance, but rebalancing cannot be performed at the time. The maintain operation at the adjusted stroke rate can be maintained until the rebalancing can be performed.

As shown in the rebalance control option 230, a calculation engine calculates parameters, such as rod torque, counterbalance torque, permissible loads, net gearbox torque, articulating inertial torque, rotary inertial torque, optimal counterbalance torque, and optimal counter balance effect. Control logic then determines a change in position of the counterweights (or other adjustable component) and updates the various torque and load parameters.

Comparable details of the maintain control option are listed in Block 240. A calculation engine calculates parameters, such as the rod torque, counterbalance torque, permissible loads, net gearbox torque, optimal articulating inertial torque, and optimal rotary inertial torque of the unit. Control logic then changes the strokes-per-minute (SPM) of the unit to maintain the safe operation of the unit 100 and to minimize the production losses.

Finally, the process 200 provides output 250 of the control options. The output can take a number of forms, such as local display of information to be implemented by a technician (90), remote communication of information at the server system (65), local instructions on a portable device (80) to implement the solution from the control options, local instructions on a control unit (60) to implement the solution from the control options, etc. For instance, the output 250 can include a local instruction from the control logic to the pump unit (100) to change the speed of the actuator (130) to provide the determined strokes-per-minute to maintain operations. In another instance, the output 250 can include displaying information locally for a technician (90) to adjust the counterweight (134) on the pumping unit (100). These and other forms of output can be provided.

The process 200 can obtain one of the at least two controls to implement the at least one of the corrections. For example, the control can be obtained directly at a local interface of the processing equipment at the pumping unit (100). Alternatively, the control can be obtained directly at a remote interface of the processing equipment and can be relayed to a local interface of the processing equipment at the pumping unit (100).

The first correction to the counterbalance (Block 230) may be calculated only in response to obtaining a first selection of the at least one control; and the second correction to the stroke parameter (Block 240) may be calculated only in response to obtaining a second selection of the at least one control. Alternatively, the first and second corrections may both be calculated regardless.

In fact, the calculations for the first and second corrections can be performed before obtaining any selection of the control. Thus, the system can perform the calculations and can automatically make a selection of the controls to implement. Results of the either or both of the calculations for the corrections can be a part of obtaining a user selection of the control. For example, a user interface of the system may show results of the calculations to a user for analysis and selection of which control solution to follow. In another example, one of the calculations may result in an impractical correction, such as an adjustment to the counterbalance that cannot be implemented physically on the pumping unit (100). In this instance, the system may only have one control available to implement so the one control would be obtained by default for implementation.

The disclosed process 200 does not require access to high voltage elements of the pumping unit (100). Using the current process 200, better accuracy can be obtained because the measurements are more directly connected to the rotary elements of the pumping unit. All of the functions can be managed remotely, and historical records may be kept to improve future pumping operations. Safe operation of the pumping unit (100) can be improved even when the out-of-balance condition is considered to be severe.

Various equations can describe the motion of the pumping unit 100 in terms of torque, which is a convenient way to describe the parameters. Based on its API designation, for example, a pumping unit 100 can have a multitude of its specific operating characteristics given by such equations. Before looking at various equations and calculations according to the present disclosure, discussion first turns to general details of the components and parameters involved.

The position and weight of the counterbalance (e.g., counterweights 134, location of wrist pin 128, etc.) is used to calculate a reaction torque at the crank arm 126. The inertia of the articulating elements and rotary elements can be known and are related to the crank arm's reaction torque.

Dedicated sensors on the pumping unit 100 (or even temporary sensors applied to the unit 100) can be used to determine the position of the horsehead 112 or the rotational angle of the crank arm 126. One particular technique that can be used is disclosed in the incorporated U.S. application Ser. No. 15/345,288.

The reaction torque of the rod load is needed to complete a calculation of required net torque. The reaction torque of the rod load is measured with a load sensor and is related to the other torques by the rotational angle of the crank arm 126.

The subject pumping unit 100 is considered properly counterbalanced when the peaks of the sum of the reaction torques are equal on the upstroke and downstroke. If the peaks of the sum of the reaction torques is unequal and the torque on the upstroke is higher than that of the downstroke, the pumping unit 100 is considered out-of-balance and is termed "rod heavy." In this situation, the counterbalance weight 134 needs to be moved further out on the crank arm 126 to increase the reaction torque of the counterbalance weight 134. Contrarily, if the peaks of the sum of the reaction torques is unequal and the torque on the downstroke is higher than that of the upstroke, then the pumping unit 100 is considered "counterbalance heavy," and the counterbalance weight 134 needs to be moved towards the rotational center of the crank arm 126. In some cases, moving the counterbalance weight 134 cannot resolve the out-of-balance condition so that some amount of counterbalance weight 134 must be added or removed.

Yet another feature of the current method is to optimize the operation of the pumping unit 100 in the event the improvement to the counterbalance position cannot be implemented immediately. In this case, a control strategy can be implemented to reduce the operating speed of the pumping unit 100 to a level that will match the effect of the articulating and rotary inertia components as well as to change the rod torque that might otherwise damage the gear reducer or other rotating parts of the pumping unit 100.

In the event that a variable speed motor controller is present, the speed of the rotating elements can be further controlled to enable safe operation of the pumping unit 100 at a higher pumping speed. Given the general details of the elements involved, discussion now turns to the equations that can be used for monitoring the pumping unit 100.

Proper balancing is done by comparing a maximum net gearbox torque on the upstroke and downstroke. The net gearbox torque is the algebraic sum of all possible torque components:

$T_r(\theta)$, Rod torque at crank angle $\theta$ (in. lbs)
$T_{CB}(\theta)$, Counterbalance torque at crank angle $\theta$ (in. lbs)
$T_{ia}(\theta)$, Articulating Inertial torque on the gearbox at crank angle $\theta$ (in. lbs)
$T_{ir}(\theta)$, Rotary Inertial torque on the crankshaft at crank angle $\theta$ (in. lbs)

The net gearbox torque is equal to:

$$T_{net}(\theta) = T_r(\theta) + T_{CB}(\theta) + T_{ia}(\theta) + T_{ir}(\theta) \tag{1}$$

Determining these parameters to balance the pumping unit 100 involves a number of factors and variables as follows. First, the principle of a torque factor is used in the analysis of the torques of the pumping unit 100. Determining a torque factor is based on the principle of a lever. In particular, the torque factor refers to a number to be multiplied by a structural load to obtain a reducer torque caused by that load.

The torque factor changes with the effects of the structural load as it moves from the carrier bar 118, to the walking beam 110, to the pitman arms 122, to the crank arms 126, and finally to the crankshaft 133 of the reducer (i.e., gearbox 132). From the conservation of energy principles, work done at the crankshaft 133 directly reflects the work done at the carrier bar 118. The torsional behavior for the torque factor of the unit 100 is bound with the kinematic behavior by:

$$f_t = \frac{\frac{du}{dt}}{\frac{d\theta}{dt}} \tag{2}$$

As noted above, rod torque is used in the analysis of the torques of the pumping unit 100. The rod torque is calculated from sensor data, namely surface position and surface load data. Depending on the installation used (e.g., walk-up or permanent installation of the sensor assembly 70, 75), the sensor data can include the surface position and the load data or can include the surface load along with the crank angle data. In the former data set, the crank angle can be inferred from the surface position. In the latter data set, the surface position can be computed from the crank angle data.

The rod load can be multiplied by the torque factor at any position to yield the portion of the reducer torque issued from the rod load. Thus, determining the rod torque requires knowledge of the measured surface loads, structural unbalance, and torque factor as a function of the crank angle. The structural unbalance is provided by the manufacturer and represents the force required at the polished rod 118 to keep the walking beam 110 in a horizontal position with the pitman 122 disconnected from the crank arms 126. The rod torque for a particular unit 100 can be computed for every stroke as a function of the crank angle using:

$$T_r(\theta) = TF(\theta)[F(\theta) - SU] \quad (3)$$

where: $TF(\theta)$ is the torque factor at crank angle ($\theta$), $F(\theta)$ is a measure of the polished rod load at crank angle, and SU is structural unbalance.

As noted above, articulating inertial torque is used in the analysis of the torques of the pumping unit 100. Articulating inertial torque arises from the energy stored in (and later released from) the oscillating parts of the pumping unit 100. Determining the articulating inertial torque requires the knowledge of the walking beam's angular acceleration $$\frac{d^2\theta_b}{dt^2}$$

and knowledge of the mass moment of inertia $I_b$ of saddle bearing (the beam 110, horsehead 112, equalizer bearings 108, and pitmans 122) as well as knowledge of the torque factor as a function of the crank angle. The articulating inertial torque can be computed for every stroke using:

$$T_{ia}(\theta) = \left(\frac{12}{32.2}\right) \cdot TF(\theta) \cdot \frac{I_b}{A} \cdot \frac{d^2\theta_b}{dt^2} \quad (4)$$

where A is distance between saddle bearing and polished rod.

The acceleration of the walking beam 100 can be modeled from the variation of the crankshaft speed using kinematics.

As noted above, rotary inertial torque is used in the analysis of the torques of the pumping unit 100. When the angular speed of the crankshaft 133 varies during the pumping cycle, the changes in speed will cause inertial forces acting on the rotating parts such as the crank arms 126 and the counterweights 134. Rotary inertial torque requires the knowledge of the crank shaft angular acceleration $$\frac{d^2\theta}{dt^2}$$

and the knowledge of the net mass moment of inertia of the rotating system $I_S$, as well as the knowledge of the torque factor as a function of the crank angle. The rotary inertial torque can be computed for every stroke using:

$$T_{ir}(\theta) = \left(\frac{12}{32.2}\right) \cdot I_s \cdot \frac{d^2\theta}{dt^2} \quad (6)$$

As the unit speeds up, inertial energy is stored in the crank arms 126 and counterweights 134, while when the unit 100 slows down that same energy is released to the system.

As noted above, counterbalance torque is used in the analysis of the torques of the pumping unit 100. The counterbalance torque requires knowledge of the crank angle $\theta$, as well as the maximum moment $T_{CBmax}$ of counterweights, cranks, and crankpins. The counterbalance torque $T_{CB}(\theta)$ can be computed for every crank angle for every stroke using:

$$T_{CB}(\theta) = -T_{CBmax} \cdot \sin\theta \quad (7)$$

The maximum counterbalance moment $T_{CBmax}$ can either be found in tables, charts, or the like supplied by the manufacturer or it can be measured at the well site. The maximum counterbalance moment $T_{CBmax}$ requires knowledge of the type of counterweight 134, weight positions, type of crank arms 126, and direction of rotation as well as the type of pumping unit 100.

The maximum moment of the counterweights $T_{CBmax}$ can be computed using the crank torque $T_c$ by:

$$T_{CBmax} = T_c + (M - D) \cdot [N \cdot W + n \cdot w] \quad (8)$$

The change in position for the counterweights 134 can also be found using:

$$D = M - \frac{(T_{CBmax} - T_C)}{NW + nw} \quad (9)$$

where D is distance of counterweight from long end of crank arm, M is maximum lever arm of counterweights, N is number of counterweights on crank arm, n is number of auxiliary weights on crank arm, W is weight of each counterweight, and w is weight of each auxiliary weight.

The change in position can also be found using the moment change and the total installed counterweights 134. The moment change is taken to be the difference in the net gearbox torque peaks on the upstroke and the downstroke. In this case the distance for the balanced position of the counterweights 134 is given by:

$$D = \frac{\Delta T_{CBmax}}{\sum NW} \quad (10)$$

The maximum moment $T_{CBmax}$ for counterbalance can also be computed using well site measurements. At this point, inertial effects have vanished because the system is in static equilibrium. Therefore, the net gearbox torque is zero, and one can rearrange and solve equation (1) for $T_{CBmax}$.

With an understanding of the torques and other parameters involved in the techniques of the present disclosure, discussion now focuses on the control options (i.e., rebalance and maintain) discussed previously with reference to FIG. 4. As noted previously, if the net gearbox torque peak on the upstroke is within a certain tolerance of the net gearbox torque peak on the downstroke, then the pumping unit 100 is considered to be in-balance. Output 250 of the monitoring process 200 in FIG. 4 may indicate such an in-balance condition.

If the net gearbox torque peak on the upstroke is less than that on the downstroke (i.e., the maximum net gearbox torque or peak torque occurs during the downstroke), then the pumping unit 100 is considered to be overbalanced or counterweights-heavy. Similarly, if the net gearbox torque on the downstroke is less than that on the upstroke or the peak torque occurs on the upstroke, then the unit 100 is said to be underbalanced or rod-heavy.

In the first control option (Block 230) of rebalance, optimal position of the counterweights 134 can be calculated. As understood, the balance requirements of the pumping unit 100 vary with the reservoir conditions. Rebalancing the unit 100 may ensure that the gearbox 132 does not get over-loaded. Additionally, balancing the unit 100 may save energy and lower the costs associated with lifting the reservoir fluids to the surface.

In the second control option (Block 240) of maintain, the well can be controlled to minimize production losses and lifting costs while delaying the re-balancing of the counterweights 134. In this second control option, optimal position of the counterweights 134 can be also calculated and stored for later retrieval when re-balancing of the counterweights 134 can be performed.

Figure 5:
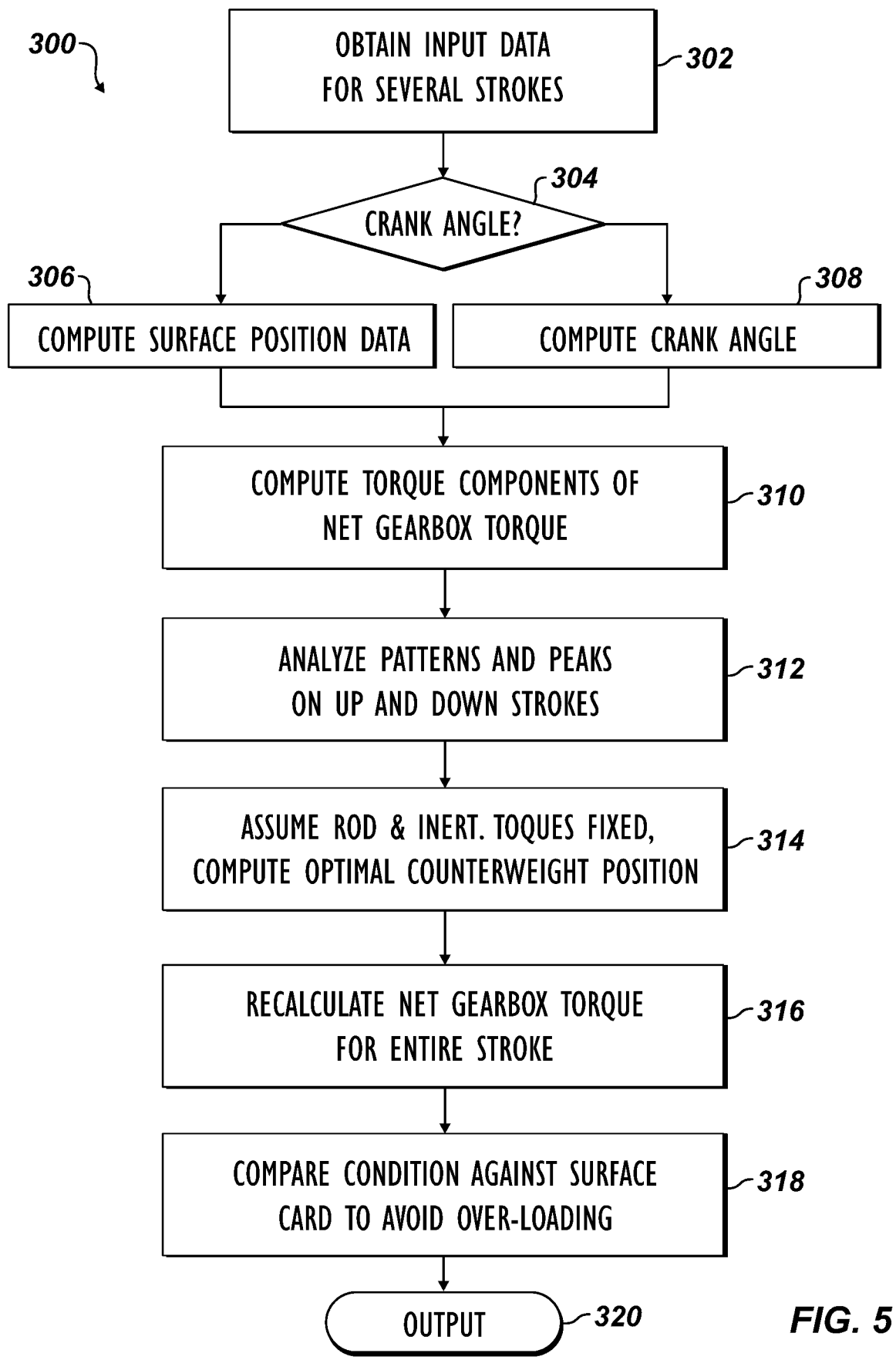
FIG. 5 illustrates a sub-process in flowchart form for rebalancing counterweight of a pumping unit in an out-of-balanced condition.

Looking at these control options in more detail, FIG. 5 illustrates a rebalance control process 300 in flowchart form. The process 300 begins by obtaining data from the sensors (152) for several strokes (Block 302). If crank angle is part of the input data (Yes-Decision 304), then the process 300 computes surface position data from the crank angel data (Block 306). If surface position data is instead part of the input data (No-Decision 304), the process 300 can infer crank angle data from surface position data (Block 308).

Using equations (1)-(6) disclosed above or any combination of such similar equations, the process 300 computes the torque components of the net gearbox torque $T_{net}(\theta)$ (Block 310). The patterns and peaks of the net gearbox torque $T_{net}(\theta)$ are analyzed on the upstroke and on the downstroke (Block 312).

In the current process 300, the rod torque $T_r(\theta)$ and the inertial torques $T_{ia}(\theta), T_{ir}(\theta)$ are assumed to stay fixed. In this case, moving the counterweights 134 will change the counterbalance torque $T_{CB}(\theta)$, thereby bringing the system into balance. Using one or a combination of several methods as given for example in equations (6)-(9) disclosed herein, an optimal position of the counterweights 134 is computed using existing well conditions—i.e., surface loads, surface positions, and crank angle (Block 314).

Once the new position is calculated, the net gearbox torque $T_{net}(\theta)$ for the entire stroke is recalculated to ensure that the peaks for the upstroke and downstroke net gearbox torques $T_{net}(\theta)$ are within a specified tolerance of each other (Block 316). Additionally, permissible load diagrams for the entire stroke can be calculated for the existing and optimal conditions and compared against the surface dynamometer card to ensure the gearbox 132 is not overloaded at any crank angle (Block 318). Finally, the information (instructions, measurements, etc.) is output as disclosed herein for implementation (Block 320).

In Block 318, the permissible load lines offer a way to evaluate the torsional loads on a pumping unit's speed reducer (i.e., gearbox 132). If any of the permissible load lines intersect the surface card, the unit 100 is overloaded. Determining the permissible load lines $P_{LL}$ requires the knowledge of the gearbox rating $G_r$, the counterbalance torque $T_{CB}(\theta)$, the structural unbalance, and the torque factor as a function of the crank angle. For example, the permissible load lines can be computed using:

$$P_{LL} = \frac{G_r + T_{CBmax}\sin\theta}{TF(\theta)} + SU \quad (11)$$

The optimal position of the counterweights 134 can be stored in memory and can be displayed to a technician 90 as a table and a report, as well as some helpful graphs. The table and report can be available on a user interface of local control unit 60, portable device 80, server system 65, and the like.

Figure 6:
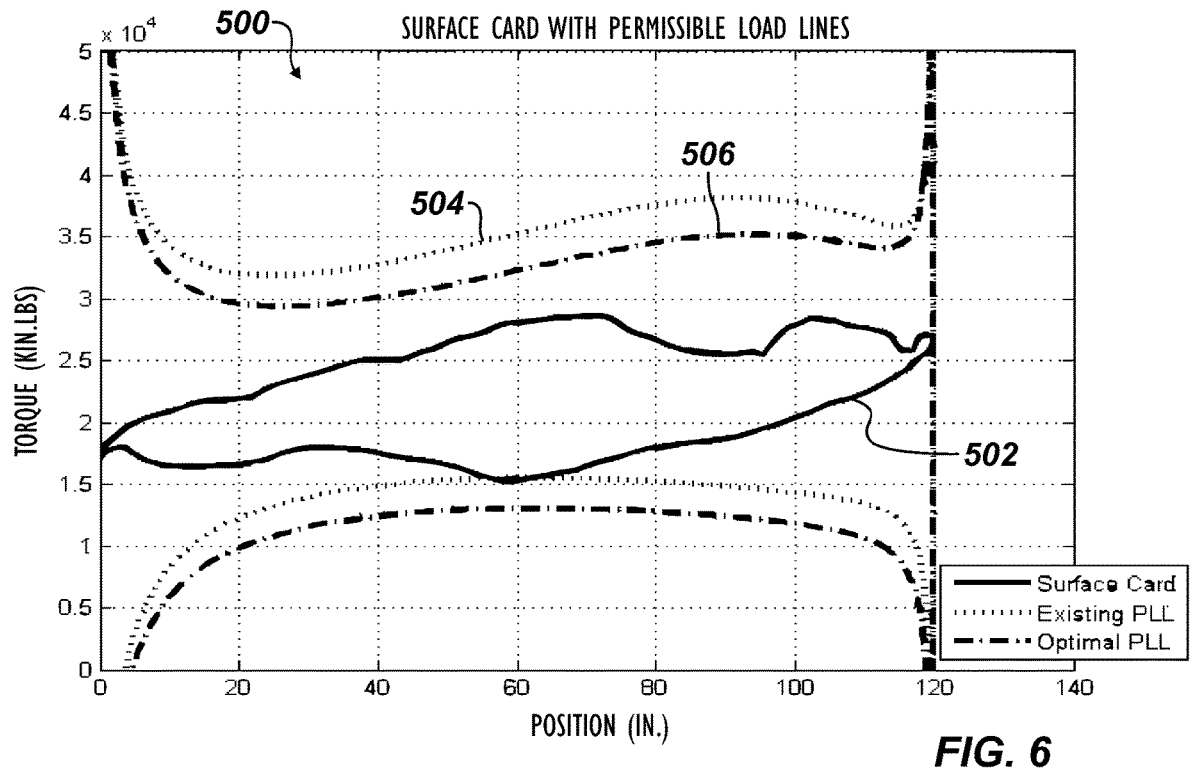
FIG. 6 illustrates a graph showing a surface card relative to permissible loads lines.

FIG. 6 illustrates one of the useful graphs 500 in this case, showing a surface card 502 with permissible loads lines 504, 506. The permissible load lines 504, 506 can be computed for all the "existing," "optimal," and "maintain" conditions. As mentioned above, this becomes a very useful reference tool because any intersection of the surface card 502 with the permissible load lines 504, 506 indicates that the gearbox (132) is overloaded.

Figure 7A:
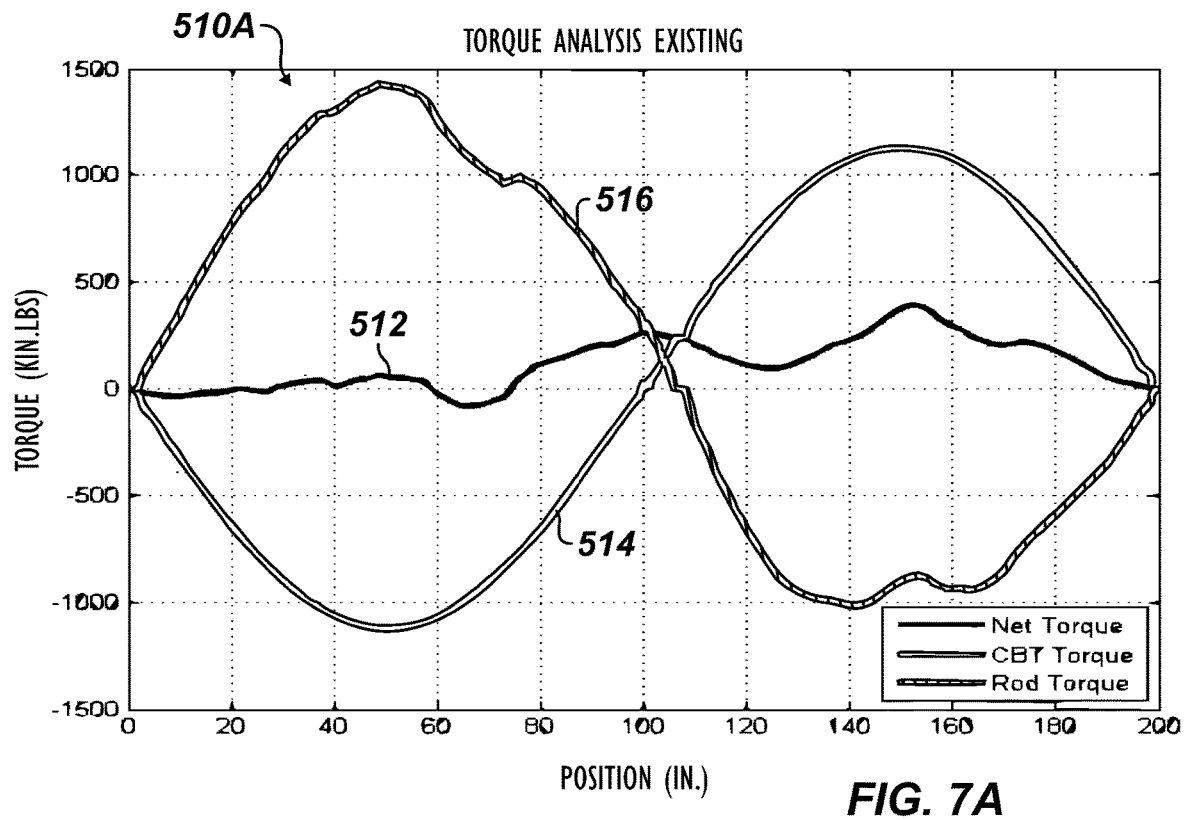
FIGS. 7A-7B illustrate existing and optimal torque graphs used in the analysis.
Figure 7B:
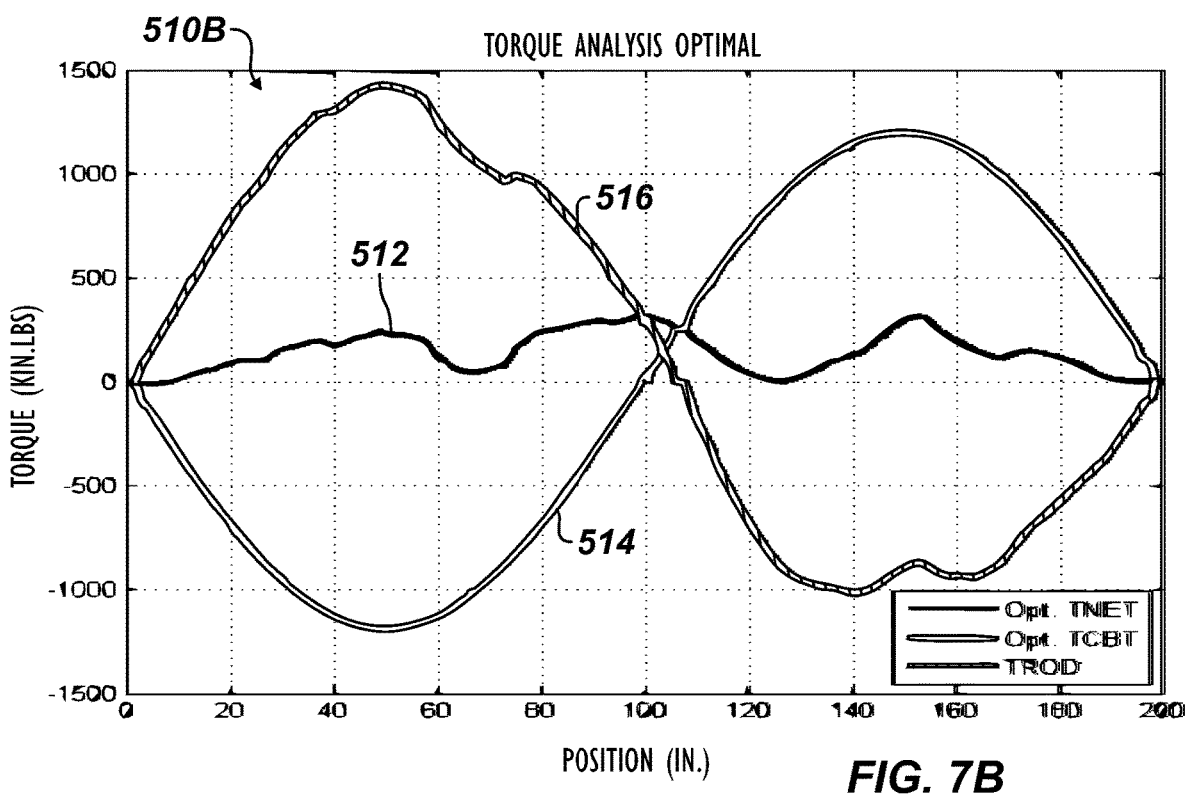

FIGS. 7A-7B illustrate existing and optimal torque graphs 510A-B that are used in the analysis and can also be displayed. These graphs 510A-B both show the above-mentioned components of the net gearbox torque including computed net torque 512 ($T_{net}(\theta)$), the counterbalance torque 514 ($T_{CB}(\theta)$), and the rod torque 516 ($T_r(\theta)$). The inertial torque components $T_{ia}(\theta), T_{ir}(\theta)$ are not graphed here, but they may also be used in the analysis and displayed.

Figure 8:
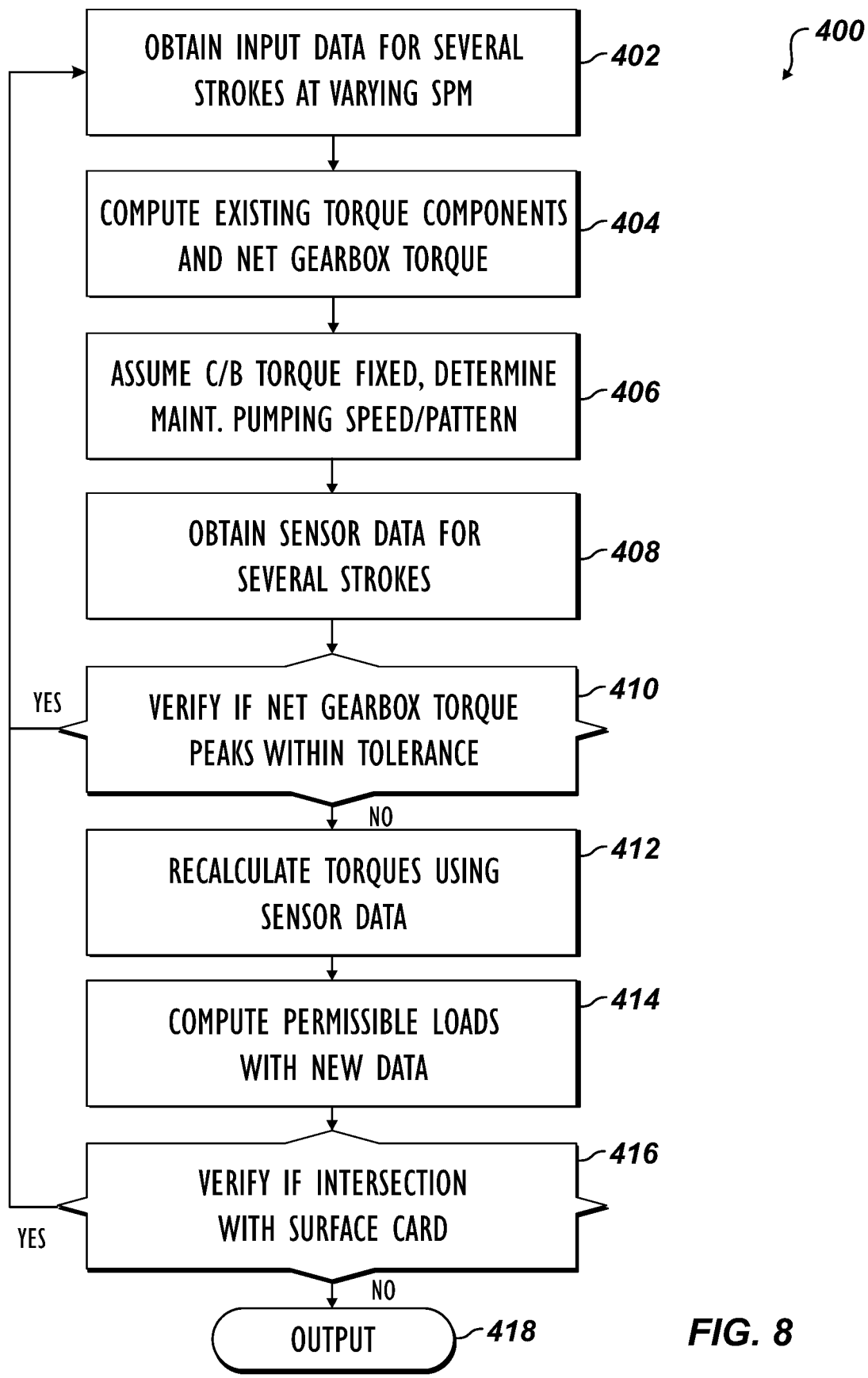
FIG. 8 illustrates a sub-process in flowchart form for maintaining operation of a pumping unit despite an out-of-balance condition.

FIG. 8 illustrates the maintain control process 400 in flowchart form. When selecting this control option, the weights 134 are not moved so the counterbalance torque $T_{net}(\theta)$ stays fixed. Applying a new pumping speed (or applying a controlling speed pattern for a pumping unit 100 linked with a variable drive) changes the other torque components, namely the rod torque $T_r(\theta)$ and the inertial torques $T_{ia}(\theta), T_{ir}(\theta)$. The resulting net gearbox torque $T_{net}(\theta)$ can then be set to a value safely out of the range of the gearbox rating $G_r$.

Figure 9:
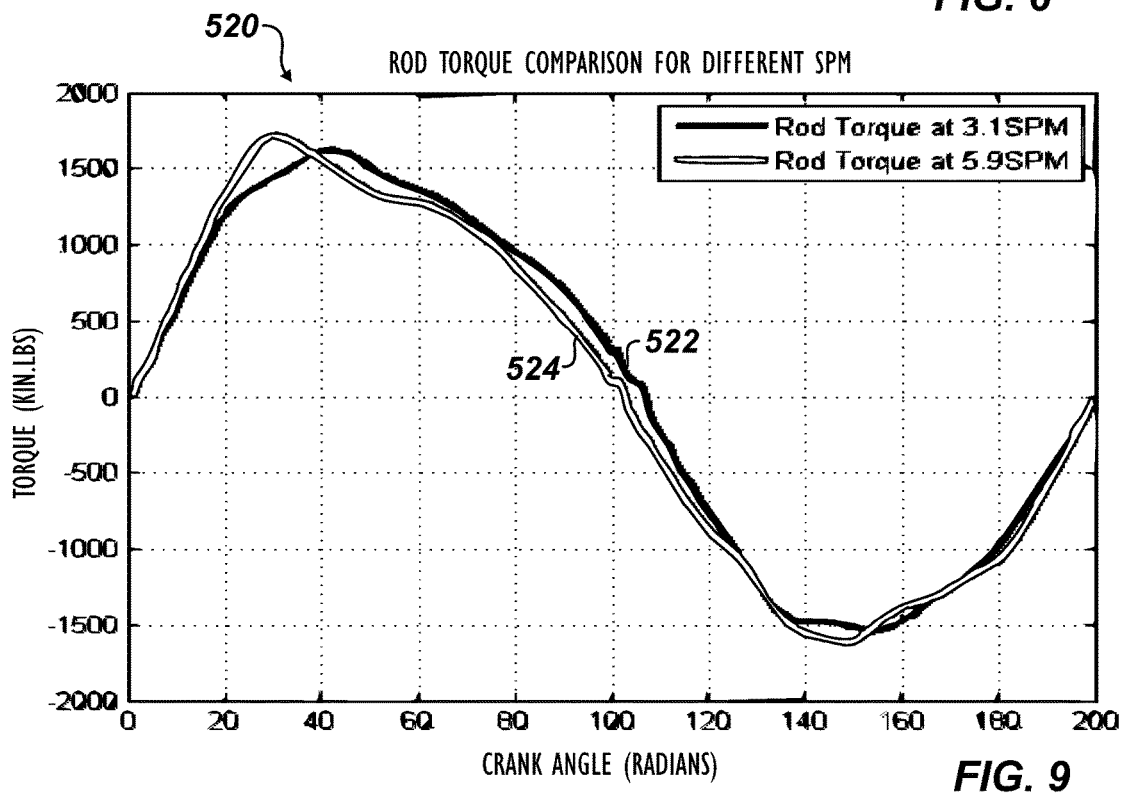
FIG. 9 illustrates a graph of rod torques at different stroke rates.

The process 400 begins by obtaining sensor data for several strokes at varying stroke rates or strokes-per-minute (SPM) (Block 402). The chosen values for the SPM include the current SPM setting of the unit 100 and preferably include values within a safe SPM range for the particular unit 100 and for the particular well. As one brief example, FIG. 9 illustrates a graph 520 of rod torques 522, 524 at different SPM.

The process 400 computes existing torque components and performs net gearbox torque analysis (Block 404). This can follow the details provided previously.

Using equation (2) disclosed herein and the computed torque components and assuming the counterbalance torque is fixed, the process 400 then determines a new stroke parameter, including a pumping speed and/or pumping pattern (Block 406). The new pumping speed (stroke rate) can be applied to the pumping unit 100 over the up and down-strokes. Alternatively, different speeds (rates) can be applied in a pattern, such as a different speed applied to one or the other of the up and down strokes depending on the capabilities of the pumping unit 100, actuator 130, gearbox 132, and the like.

Once the new stroke parameter has been applied to the pumping unit 100, the process 400 records sensor data again for several strokes (Block 408). The peaks of the net gearbox torque $T_{net}(\theta)$ on the upstroke and downstroke are then verified to be within specified tolerance of each other (Block 410). If not, the process 400 may need to reanalyze the information, offer another solution, etc.

Using "Maintain" sensor data, the process 400 recalculates rod torque $T_r(\theta)$ and inertial torques $T_{ia}(\theta)$, $T_{ir}(\theta)$ and ultimately the net gear box torque $T_{net}(\theta)$ (Block 412). Permissible loads can be computed with the new data (Block 414) to verify that they do not intersect with the surface card (Decision 416). If there is intersection, the process 400 may need to reanalyze the information, offer another solution, etc. Finally, the information (instructions, measurements, etc.) is output as disclosed herein for implementation (Block 418).

The rebalancing process 400 has a great advantage when used with a local control unit 70 or variable drive actuator 130 at the pumping unit 100. In these instances, the rebalancing process 400 can be a control option for the local control unit 70 and can be processed locally or remotely. The local control unit 70 is taught to self-correct and autonomously modify pumping speed or update speed pattern to match reservoir conditions as well as out-of-balance conditions. Notification of the out-of-balance condition can be sent remotely so a rebalancing of the pumping unit 100 can be scheduled. This provides the pumping unit 100 with a way to stay within desired operating limits while minimize lifting costs and production losses until rebalancing the unit 100 becomes available.

Figure 10:
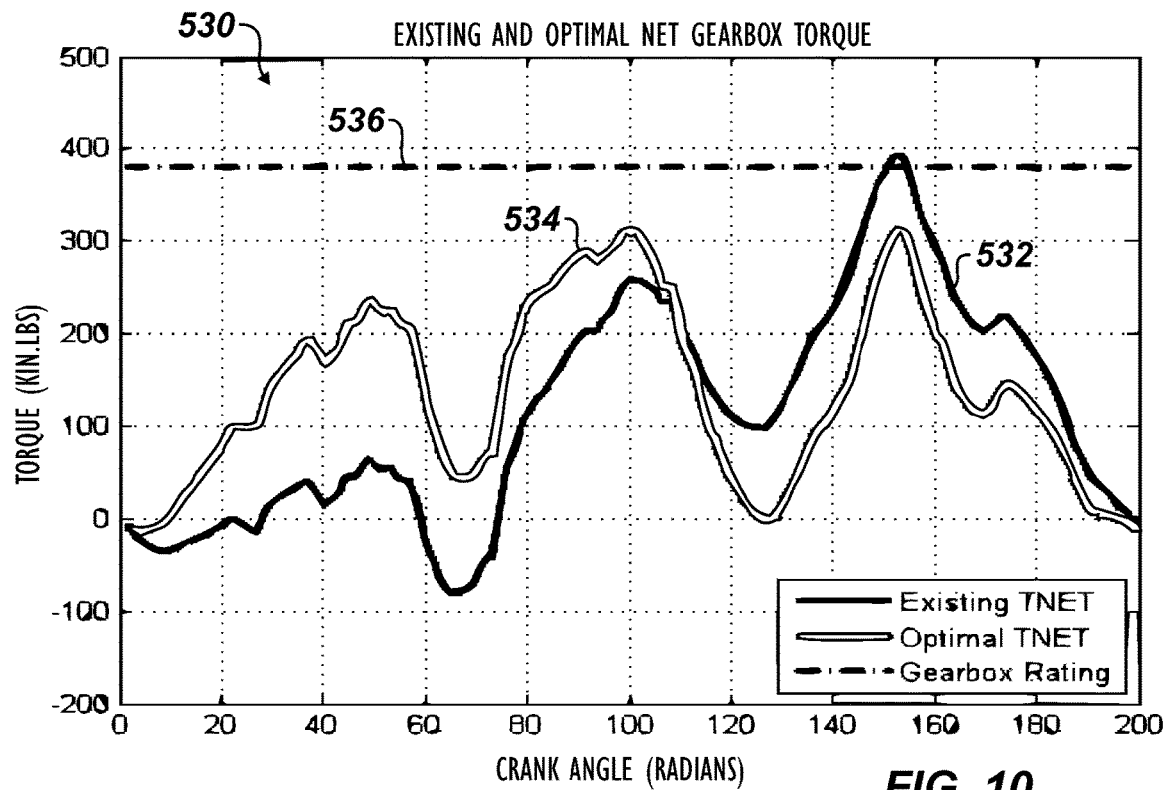
FIG. 10 illustrates a graph of existing net gearbox torque compared to optimal net gearbox torque.

The existing net gearbox torque $T_{net}(\theta)$ can be used in the analysis and can be displayed along with the optimal and/or maintain net gearbox torque $T_{net}(\theta)$ to illustrate the improvement in efficiency brought by the solutions. The analysis and display can also use the gearbox rating $G_r$. For example, FIG. 10 illustrates a graph 530 of the existing net gearbox torque 532 compared to the optimal net gearbox torque 534. As with the permissible load lines, if the curves of these net gearbox torques 532, 534 intersect the gearbox torque rating line 536 for any crank angle, then the unit (100) is overloaded.

Figure 11:
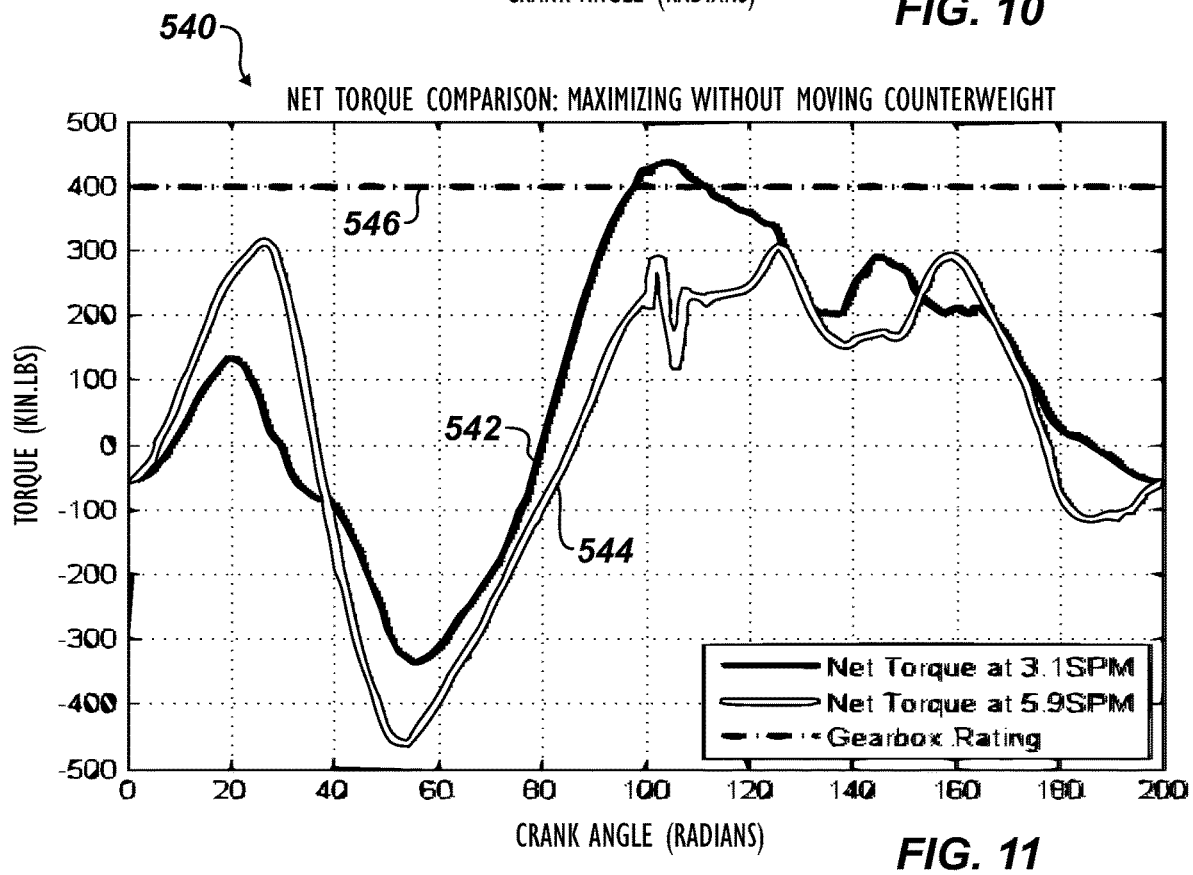
FIG. 11 illustrates a graph of net gearbox torques at different stroke rates.

The net gearbox torque $T_{net}(\theta)$ at the different SPMs can be used in the analysis and displayed along with the gearbox rating $G_r$ to illustrate the improvement in efficiency brought by the solutions. For example, FIG. 11 illustrates a graph 540 of the net gearbox torque 542 at a first (i.e., current) SPM compared to the optimal net gearbox torque 544 at a second (i.e., new) SPM. As with the permissible load lines, if the curves of these net gearbox torques 532, 534 intersect the gearbox torque rating line 546 for any crank angle, then the unit (100) is overloaded.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A method of handling one or more pumping units in an out-of-balance condition, the method comprising:
    monitoring, with sensing equipment, operating parameters of each of the one or more pumping units, the operating parameters related to balance of the one or more pumping units;
    determining, with processing equipment, the out-of-balance condition of at least one of the one or more pumping units based on the monitored operating parameters;
    calculating, with the processing equipment, a first correction indicating a counterbalance parameter change in a counterweight of the at least one pumping unit;
    calculating, with the processing equipment, a second correction indicating a stroke parameter change in an actuator of the at least one pumping unit;
    automatically selecting, with the processing equipment, one of the first and second corrections by comparing results of the calculations; and
    countering the out-of-balance condition by implementing the selected one of the first and second corrections at the at least one pumping unit.

2. The method of claim 1, wherein monitoring with the sensing equipment comprises permanently or temporarily installing the sensing equipment on the at least one pumping unit.

3. The method of claim 1, wherein monitoring the operating parameters comprises monitoring surface load and at least one of surface position and crank angle.

4. The method of claim 1, wherein determining the out-of-balance condition of the at least one pumping unit based on the monitored operating parameters comprises determining that a first peak of a net gearbox torque on an upstroke of the at least one pumping unit is less or more than a second peak of the net gearbox torque on a downstroke.

5. The method of claim 1, wherein implementing the selected one of the first and second corrections at the at least one pumping unit comprises obtaining, with the processing equipment, a control to implement the selected one of the first and second corrections.

6. The method of claim 5, wherein obtaining the control comprises at least one of:
    obtaining the control directly at a local interface of the processing equipment at the at least one pumping unit; and
    obtaining the control directly at a remote interface of the processing equipment and relaying the control to a local interface of the processing equipment at the at least one pumping unit.

7. The method of claim 1, wherein calculating the first correction comprises determining a new position and/or a new amount of the counterweight of the at least one pumping unit as the counterbalance parameter change for the first correction by adjusting a counterbalance torque relative to a rod torque and inertial torques of the at least one pumping unit under the operating parameters.

8. The method of claim 7, wherein countering the out-of-balance condition by implementing the first correction as the selected one of the corrections at the at least one pumping unit comprises adjusting the counterweight of the at least one pumping unit to the determined new position and/or new amount.

9. The method of claim 1, wherein calculating the second correction comprises determining at least one of a pumping speed and a pumping pattern as the stroke parameter change of the second correction using a torque factor and torque components of the at least one pumping unit.

10. The method of claim 9, wherein countering the out-of-balance condition by implementing the second correction as the selected one of the corrections at the at least one pumping unit comprises adjusting the actuator of the at least one pumping unit with the at least one of the pumping speed and pumping pattern.

11. A system of handling a plurality of pumping units in an out-of-balance condition, the system comprising:
  sensing equipment monitoring operating parameters of each of the pumping units, the operating parameters related to balance of the one or more pumping units;
  processing equipment in communication with the sensing equipment, the processing equipment being configured to:
    determine the out-of-balance condition in at least one of the pumping units based on the monitored operating parameters,
    calculate a first correction indicating a counterbalance parameter change in a counterweight of the at least one pumping unit to counter the out-of-balance condition,
    calculate a second correction indicating a stroke parameter change in an actuator of the at least one pumping unit to counter the out-of-balance condition,
    automatically select one of the first and second corrections based on a comparison of results of the calculations; and
  communication equipment in communication with the processing equipment and communicating information for implementing the selected one of the first and second corrections at the at least one pumping unit to counter the out-of-balance condition.

12. The system of claim 11, wherein:
  the sensing equipment comprises one or more of a removable assembly, a permanent assembly, an orientation sensor, a magnetometer, a velocity sensor, a gyrometer, an acceleration sensor, and an accelerometer;
  the processing equipment comprises one or more of a portable device, a local control unit, a remote control unit, and a server system; and
  the communication equipment comprises one or more of a wireless interface, a wired interface, and a user interface of the processing equipment.

13. The system of claim 11, wherein the communication equipment obtains at least one control to implement the at least one of the first and second corrections; and wherein the processing equipment is configured to calculate at least one of the first and second corrections in response to the at least one control obtained.

14. A method of rebalancing a pumping unit in an out-of-balance condition, the method comprising:
  monitoring, with sensing equipment, operating parameters of the pumping unit, the operating parameters related to balance of the pumping unit;
  determining, with processing equipment, the out-of-balance condition of the pumping unit based on the monitored operating parameters by determining that a first peak of a net gearbox torque on an upstroke of the at least one pumping unit is less or more than a second peak of the net gearbox torque on a downstroke;
  obtaining, with the processing equipment from the sensing equipment, input of the operating parameters for a plurality of strokes of the pumping unit;
  computing, with the processing equipment, torque components of the pumping unit from the obtained input;
  determining, with the processing equipment, a new counterbalance parameter of the pumping unit from the computed torque components; and
  correcting the out-of-balance condition by changing a counterbalance of the pumping unit based on the determined counterbalance parameter.

15. The method of claim 14, wherein determining the new counterbalance parameter of the pumping unit from the computed torque components comprises assuming rod and inertial torques are fixed; and balancing patterns and peaks of up and down strokes of the pumping unit.

16. The method of claim 14, wherein determining the new counterbalance parameter comprises determining a new position of a counterweight of the pumping unit; and wherein changing the counterbalance of the pumping unit comprises changing the counterweight to the new determined position.

17. The method of claim 14, wherein determining the out-of-balance condition further comprises:
  recalculating a net gearbox torque of the pumping unit based on the determined new position, and
  verifying any over-loading by comparing a condition of the pumping unit with the recalculated net gearbox torque against surface data of the pumping unit.

18. A method of modifying operation of a pumping unit in an out-of-balance condition, the method comprising:
  monitoring, with sensing equipment, operating parameters of the pumping unit, the operating parameters related to balance of the pumping unit;
  determining, with processing equipment, the out-of-balance condition of the pumping unit based on the monitored operating parameters by determining that a first peak of a net gearbox torque on an upstroke of the at least one pumping unit is less or more than a second peak of the net gearbox torque on a downstroke;
  obtaining, with the processing equipment from the sensing equipment, input of the operating parameters for a plurality of strokes of the pumping unit at a plurality of stroke rates;
  computing, with the processing equipment, existing torque components of the pumping unit from the obtained input;
  determining, with the processing equipment, a new stroke parameter of the pumping unit from the computed torque components; and
  countering the out-of-balance condition by changing the pumping unit to the determined new stroke parameter.

19. The method of claim 18, further comprising verifying that any peaks of a net gearbox torque are within a gearbox rating of the pumping unit.

20. The method of claim 18, wherein determining the new stroke parameter comprises determining a least one of a new stroke rate and a new stroke pattern.

21. The method of claim 1, wherein automatically selecting the one of the first and second corrections by comparing the results of the calculations comprises determining the result of one of the first and second corrections produces an impractical correction beyond a physical limit of the at least one pumping unit; and automatically selecting the other of the first and second corrections by default as the selected one.

22. The method of claim 1, wherein automatically selecting the one of the first and second corrections by comparing the results of the calculations comprises:
  determining that the result of the calculation for the counterbalance parameter change is implementable at a present time and selecting the first correction to the counterbalance parameter change as the selected correction for implementation.

23. The method of claim 1, wherein automatically selecting the one of the first and second corrections by comparing the results of the calculations comprises:
  determining that the result of the calculation for the counterbalance parameter change is not implementable at a present time and selecting the second correction to the stroke parameter change as the selected correction for implementation; and maintaining the second correction to the stroke parameter change as the selected correction for implementation at least until the counterbalance parameter change is implementable.

* * * * *